(12) United States Patent
Bennett

(10) Patent No.: US 10,176,861 B2
(45) Date of Patent: *Jan. 8, 2019

(54) RAIDED MEMORY SYSTEM MANAGEMENT

(71) Applicant: Violin Systems LLC, San Jose, CA (US)

(72) Inventor: Jon C. R. Bennett, Sudbury, MA (US)

(73) Assignee: VIOLIN SYSTEMS LLC, San Jose, CA (US)

(*) Notice: Subject to any disclaimer, the term of this patent is extended or adjusted under 35 U.S.C. 154(b) by 484 days.

This patent is subject to a terminal disclaimer.

(21) Appl. No.: 14/882,000

(22) Filed: Oct. 13, 2015

(65) Prior Publication Data

US 2016/0085453 A1    Mar. 24, 2016

Related U.S. Application Data

(63) Continuation of application No. 12/199,386, filed on Aug. 27, 2008, now Pat. No. 9,384,818, which is a
(Continued)

(51) Int. Cl.
*G06F 12/00*    (2006.01)
*G11C 11/4076*    (2006.01)
(Continued)

(52) U.S. Cl.
CPC ........ *G11C 11/4076* (2013.01); *G06F 1/3203* (2013.01); *G06F 1/3225* (2013.01);
(Continued)

(58) Field of Classification Search
CPC ... G11C 11/4076; G06F 1/3203; G06F 3/064; G06F 2212/7502; Y02D 10/12
See application file for complete search history.

(56) References Cited

U.S. PATENT DOCUMENTS 3,728,679 A    4/1973   Mcintosh
3,970,798 A    7/1976   Epenoy et al.
(Continued)

FOREIGN PATENT DOCUMENTS

EP        0977121 A2    2/2000
EP        1 369 767 A1   12/2003
(Continued)

OTHER PUBLICATIONS

Unknown author, Intel®, "Understanding the Flash Translation Layer (FTL) Specification", Dec. 1998, Order No. 297816-002, © 1997, Intel Corporation, pp. 1-20.
(Continued)

*Primary Examiner* — Arvind Talukdar
(74) *Attorney, Agent, or Firm* — Schwabe Williamson & Wyatt

(57) ABSTRACT

A memory system is described, where a plurality of memory modules is connected to a memory controller. Erase operations of the memory modules are coordinated by the memory controller such that, when data is stored in a group of memory modules configured to be a RAID (Redundant Array of Independent "Disks") group, erase or refresh operations performed on the memory modules of the RAID group are synchronized, scheduled, or controlled to reduce the latency in reading the data stored on the RAID modules.

13 Claims, 8 Drawing Sheets

Related U.S. Application Data continuation-in-part of application No. 11/405,083, filed on Apr. 17, 2006, now Pat. No. 8,726,064, said application No. 12/199,386 is a continuation-in-part of application No. 12/079,364, filed on Mar. 26, 2008, now Pat. No. 8,200,887.

(60) Provisional application No. 60/674,189, filed on Apr. 21, 2005, provisional application No. 60/698,626, filed on Jul. 11, 2005, provisional application No. 60/920,737, filed on Mar. 29, 2007, provisional application No. 60/967,101, filed on Aug. 31, 2007.

(51) Int. Cl.
  *G06F 1/32* (2006.01)
  *G11C 5/04* (2006.01)
  *G11C 11/406* (2006.01)
  *G11C 11/4074* (2006.01)
  *G06F 3/06* (2006.01)

(52) U.S. Cl.
  CPC .......... *G06F 1/3275* (2013.01); *G06F 3/064* (2013.01); *G06F 3/0608* (2013.01); *G06F 3/0652* (2013.01); *G06F 3/0688* (2013.01); *G06F 3/0689* (2013.01); *G11C 5/04* (2013.01); *G11C 11/406* (2013.01); *G11C 11/4074* (2013.01); *G11C 11/40611* (2013.01); *G06F 2212/7202* (2013.01); *G11C 2211/4067* (2013.01); *Y02D 10/13* (2018.01); *Y02D 10/14* (2018.01); *Y02D 50/20* (2018.01)

(56) References Cited

U.S. PATENT DOCUMENTS

| | | |
|---|---|---|
| 4,128,882 A | 12/1978 | Dennis |
| 4,240,143 A | 12/1980 | Besemer et al. |
| 4,263,651 A | 4/1981 | Donath |
| 4,322,849 A | 3/1982 | Calabrese |
| 4,323,849 A | 4/1982 | Smith |
| 4,363,094 A | 12/1982 | Kaul et al. |
| 4,383,314 A | 5/1983 | Tam |
| 4,386,323 A | 5/1983 | Jansen |
| 4,543,630 A | 9/1985 | Neches |
| 4,558,455 A | 12/1985 | Epenoy et al. |
| 4,701,756 A | 10/1987 | Burr |
| 4,703,451 A | 10/1987 | Calabrese |
| 4,756,011 A | 7/1988 | Cordell |
| 4,805,195 A | 2/1989 | Keegan |
| 4,843,288 A | 6/1989 | Volz et al. |
| 4,845,709 A | 7/1989 | Matsumoto et al. |
| 4,860,201 A | 8/1989 | Stolfo et al. |
| 4,881,165 A | 11/1989 | Sager et al. |
| 4,910,669 A | 3/1990 | Gorin et al. |
| 4,922,409 A | 5/1990 | Schoelkopf et al. |
| 5,041,964 A | 8/1991 | Cole et al. |
| 5,053,942 A | 10/1991 | Srini |
| 5,128,810 A | 7/1992 | Halford |
| 5,144,166 A | 9/1992 | Camarota |
| 5,200,746 A | 4/1993 | Yoshifuji |
| 5,283,877 A | 2/1994 | Gastinel |
| 5,285,441 A | 2/1994 | Bansal |
| 5,313,501 A | 5/1994 | Thacker |
| 5,365,487 A | 11/1994 | Patel et al. |
| 5,379,262 A | 1/1995 | Okamoto et al. |
| 5,467,040 A | 11/1995 | Nelson et al. |
| 5,507,029 A | 4/1996 | Granato |
| 5,522,031 A | 5/1996 | Ellis et al. |
| 5,621,774 A | 4/1997 | Ishibashi |
| 5,623,595 A | 5/1997 | Bailey |
| 5,652,530 A | 7/1997 | Ashuri |
| 5,680,579 A | 10/1997 | Young et al. |
| 5,687,183 A | 11/1997 | Chesley |
| 5,752,045 A | 5/1998 | Chen |
| 5,828,253 A | 10/1998 | Murayama |
| 5,832,286 A | 11/1998 | Yoshida |
| 5,872,959 A | 2/1999 | Nguyen |
| 5,889,714 A | 3/1999 | Schumann et al. |
| 5,889,795 A | 3/1999 | Niijima et al. |
| 5,901,101 A | 5/1999 | Suzuki et al. |
| 5,920,704 A | 7/1999 | Oinowich |
| 5,923,830 A | 7/1999 | Fuch et al. |
| 5,960,034 A | 9/1999 | Lo |
| 5,974,487 A | 10/1999 | Hartmann |
| 5,974,503 A | 10/1999 | Venkatesh |
| 6,009,547 A | 12/1999 | Jaquette et al. |
| 6,015,144 A | 1/2000 | Yoshii |
| 6,031,847 A | 2/2000 | Collins |
| 6,038,570 A | 3/2000 | Hitz |
| 6,105,144 A | 8/2000 | Wu |
| 6,118,612 A | 9/2000 | Judd et al. |
| 6,134,167 A | 10/2000 | Atkinson |
| 6,138,185 A | 10/2000 | Nelson et al. |
| 6,151,289 A | 11/2000 | Rope et al. |
| 6,157,229 A | 12/2000 | Yoshikawa |
| 6,185,134 B1 | 2/2001 | Tanaka |
| 6,185,654 B1 | 2/2001 | Van Doren |
| 6,205,571 B1 | 3/2001 | Camporese et al. |
| 6,208,667 B1 | 3/2001 | Caldara |
| 6,226,708 B1 | 5/2001 | McGoldrick et al. |
| 6,233,650 B1 | 5/2001 | Johnson et al. |
| 6,237,052 B1 | 5/2001 | Stolowitz |
| 6,238,220 B1 | 5/2001 | Hsu |
| 6,260,151 B1 | 7/2001 | Omizo |
| 6,295,568 B1 | 9/2001 | Kelley |
| 6,297,684 B1 | 10/2001 | Uyehara et al. |
| 6,301,167 B1 | 10/2001 | Lee |
| 6,301,244 B1 | 10/2001 | Huang et al. |
| 6,304,497 B1 | 10/2001 | Roohparvar |
| 6,310,814 B1 | 10/2001 | Hampel et al. |
| 6,317,352 B1 | 11/2001 | Halbert et al. |
| 6,321,345 B1 | 11/2001 | Mann et al. |
| 6,334,167 B1 | 12/2001 | Gerchman et al. |
| 6,335,647 B1 | 1/2002 | Nagano |
| 6,335,930 B1 | 1/2002 | Lee |
| 6,345,321 B1 | 2/2002 | Litaize et al. |
| 6,353,895 B1 | 3/2002 | Stephenson |
| 6,356,610 B1 | 3/2002 | Ott |
| 6,359,815 B1 | 3/2002 | Sato |
| 6,369,605 B1 | 4/2002 | Bonella et al. |
| 6,370,200 B1 | 4/2002 | Takahashi |
| 6,374,337 B1 | 4/2002 | Estakhri |
| 6,378,018 B1 | 4/2002 | Tsern |
| 6,417,713 B1 | 7/2002 | DeRyckere |
| 6,425,052 B1 | 7/2002 | Hashemi |
| 6,425,114 B1 | 7/2002 | Chan |
| 6,442,644 B1 | 8/2002 | Gustavson et al. |
| 6,445,719 B1 | 9/2002 | Schneider et al. |
| 6,446,174 B1 | 9/2002 | Dow |
| 6,449,667 B1 | 9/2002 | Ganmukhi et al. |
| 6,473,439 B1 | 10/2002 | Zerbe |
| 6,473,827 B2 | 10/2002 | McMillen et al. |
| 6,493,205 B2 | 12/2002 | Bauer |
| 6,493,250 B2 | 12/2002 | Halbert et al. |
| 6,502,161 B1 | 12/2002 | Perego et al. |
| 6,539,463 B1 | 3/2003 | Kuwata |
| 6,553,450 B1 | 4/2003 | Dodd et al. |
| 6,557,110 B2 | 4/2003 | Sakamoto |
| 6,567,311 B2 | 5/2003 | Ishii et al. |
| 6,571,333 B1 | 5/2003 | Jain et al. |
| 6,581,185 B1 | 6/2003 | Hughes |
| 6,591,339 B1 | 7/2003 | Horst et al. |
| 6,601,178 B1 | 7/2003 | Gulick |
| 6,611,518 B1 | 8/2003 | Ngo et al. |
| 6,618,791 B1 | 9/2003 | Dodd et al. |
| 6,625,687 B1 | 9/2003 | Halbert et al. |
| 6,636,932 B1 | 10/2003 | Regev |
| 6,636,993 B1 | 10/2003 | Koyanagi |
| 6,647,027 B1 | 11/2003 | Gasparik |
| 6,658,509 B1 | 12/2003 | Bonella et al. |
| 6,667,927 B2 | 12/2003 | Jones, Jr. |
| 6,678,783 B2 | 1/2004 | Ozawa |
| 6,681,338 B1 | 1/2004 | Kollipara |

(56) References Cited

U.S. PATENT DOCUMENTS

| | | |
|---|---|---|
| 6,684,314 B1 | 1/2004 | Manter |
| 6,697,974 B2 | 2/2004 | Craft |
| 6,735,397 B2 | 5/2004 | Herrity |
| 6,751,155 B2 | 6/2004 | Gorobets |
| 6,799,235 B2 | 9/2004 | Borman et al. |
| 6,803,872 B2 | 10/2004 | DeRyckere |
| 6,807,377 B1 | 10/2004 | Watanabe |
| 6,833,618 B2 | 12/2004 | Ono et al. |
| 6,834,326 B1 | 12/2004 | Wang et al. |
| 6,845,461 B1 | 1/2005 | Kim |
| 6,871,253 B2 | 3/2005 | Greef et al. |
| 6,874,097 B1 | 3/2005 | Aliahmad |
| 6,882,082 B2 | 4/2005 | Greef et al. |
| 6,904,050 B2 | 6/2005 | Chao |
| 6,928,512 B2 | 8/2005 | Ayukawa et al. |
| 6,928,571 B1 | 8/2005 | Bonella et al. |
| 6,937,681 B2 | 8/2005 | Watanabe |
| 6,961,347 B1 | 11/2005 | Bunton et al. |
| 6,968,419 B1 | 11/2005 | Holman |
| 6,983,354 B2 | 1/2006 | Jeddeloh |
| 6,996,686 B2 | 2/2006 | Doblar |
| 7,012,811 B1 | 3/2006 | Jiang et al. |
| 7,013,361 B2 | 3/2006 | Liron |
| 7,064,992 B2 | 6/2006 | Bell |
| 7,065,101 B2 | 6/2006 | Ziegler |
| 7,085,950 B2 | 8/2006 | Ehmann |
| 7,111,140 B2 | 9/2006 | Estakhri et al. |
| 7,113,012 B2 | 9/2006 | Amin |
| 7,123,660 B2 | 10/2006 | Haq |
| 7,130,317 B2 | 10/2006 | Annadurai |
| 7,136,964 B2 | 11/2006 | Yamamoto |
| 7,139,347 B2 | 11/2006 | Fujita |
| 7,143,305 B2 | 11/2006 | Hajji et al. |
| 7,149,950 B2 | 12/2006 | Spencer et al. |
| 7,164,615 B2 | 1/2007 | Park et al. |
| 7,167,361 B2 | 1/2007 | Lin |
| 7,191,304 B1 | 3/2007 | Cameron et al. |
| 7,193,429 B2 | 3/2007 | Okuyama |
| 7,203,889 B2 | 4/2007 | Oza et al. |
| 7,205,803 B2 | 4/2007 | Chung |
| 7,206,888 B2 | 4/2007 | Byers |
| 7,213,103 B2 | 5/2007 | Eng et al. |
| 7,280,538 B2 | 10/2007 | Li |
| 7,304,520 B2 | 12/2007 | Cho |
| 7,310,703 B2 | 12/2007 | Frolund |
| 7,328,362 B2 | 2/2008 | Chiang |
| 7,356,730 B2 | 4/2008 | Ulrich et al. |
| 7,363,455 B2 | 4/2008 | Shimada et al. |
| 7,366,852 B2 | 4/2008 | Hung |
| 7,430,728 B1 | 9/2008 | Rahut |
| 7,433,441 B2 | 10/2008 | Jenkins |
| 7,451,265 B2 | 11/2008 | Traister et al. |
| 7,490,189 B2 | 2/2009 | Eberle et al. |
| 7,512,861 B2 | 3/2009 | Taylor |
| 7,516,029 B2 | 4/2009 | Kim |
| 7,525,356 B2 | 4/2009 | Hui |
| 7,539,800 B2 | 5/2009 | Dell |
| 7,551,640 B1 | 6/2009 | Klecka |
| RE40,877 E | 8/2009 | Singhal et al. |
| 7,609,695 B2 | 10/2009 | Zhu et al. |
| 7,643,517 B2 | 1/2010 | Annadurai |
| 7,653,776 B2 | 1/2010 | Cornelius et al. |
| 7,668,271 B2 | 2/2010 | Kim |
| 7,668,272 B1 | 2/2010 | Obeidat |
| 7,734,867 B1 | 6/2010 | Keeton |
| 7,751,713 B2 | 7/2010 | Perkins |
| 7,818,525 B1 | 10/2010 | Frost |
| 7,984,084 B2 | 7/2011 | Sinclair |
| 2001/0039601 A1 | 11/2001 | Leung |
| 2001/0040827 A1 | 11/2001 | Dosaka et al. |
| 2002/0007469 A1 | 1/2002 | Taketa et al. |
| 2002/0009169 A1 | 1/2002 | Watanabe |
| 2002/0026600 A1 | 2/2002 | Jung et al. |
| 2002/0046322 A1 | 4/2002 | Butterworth et al. |
| 2002/0072135 A1 | 6/2002 | Adachi et al. |
| 2002/0073285 A1 | 6/2002 | Butterworth |
| 2002/0083379 A1 | 6/2002 | Nishikawa et al. |
| 2002/0084458 A1 | 7/2002 | Halbert et al. |
| 2002/0099904 A1 | 7/2002 | Conley |
| 2002/0103966 A1 | 8/2002 | Wu et al. |
| 2002/0112119 A1 | 8/2002 | Halbert et al. |
| 2002/0120901 A1 | 8/2002 | Poirier et al. |
| 2002/0124153 A1 | 9/2002 | Litaize et al. |
| 2002/0178314 A1 | 11/2002 | Cho |
| 2002/0191467 A1 | 12/2002 | Matsumoto et al. |
| 2003/0018880 A1 | 1/2003 | Litaize et al. |
| 2003/0001880 A1 | 2/2003 | Holtz et al. |
| 2003/0046489 A1 | 3/2003 | Yagi |
| 2003/0056142 A1 | 3/2003 | Hashemi |
| 2003/0058021 A1 | 3/2003 | Lee et al. |
| 2003/0061447 A1 | 3/2003 | Perego et al. |
| 2003/0084235 A1 | 5/2003 | Mizuki |
| 2003/0084397 A1 | 5/2003 | Peleg |
| 2003/0091039 A1 | 5/2003 | Ziegler |
| 2003/0095575 A1 | 5/2003 | Annadurai et al. |
| 2003/0097524 A1 | 5/2003 | Brant |
| 2003/0105928 A1 | 6/2003 | Ash |
| 2003/0110343 A1 | 6/2003 | Hagiwara et al. |
| 2003/0117172 A1 | 6/2003 | Wu et al. |
| 2003/0120895 A1 | 6/2003 | Litaize et al. |
| 2003/0126485 A1 | 7/2003 | Wilcox et al. |
| 2003/0163606 A1 | 8/2003 | Fukaishi et al. |
| 2003/0193927 A1 | 10/2003 | Hronik |
| 2003/0206164 A1 | 11/2003 | Juenger |
| 2003/0208511 A1 | 11/2003 | Earl et al. |
| 2003/0212858 A1 | 11/2003 | Apperley et al. |
| 2003/0236939 A1 | 12/2003 | Kleveland et al. |
| 2004/0004897 A1 | 1/2004 | Kang |
| 2004/0062119 A1 | 4/2004 | Stimak et al. |
| 2004/0073767 A1 | 4/2004 | Johnson et al. |
| 2004/0117569 A1 | 6/2004 | Kyung |
| 2004/0122985 A1 | 6/2004 | Parra et al. |
| 2004/0139293 A1 | 7/2004 | Barth et al. |
| 2004/0153817 A1 | 8/2004 | Norman et al. |
| 2004/0153902 A1 | 8/2004 | Machado et al. |
| 2004/0184336 A1 | 9/2004 | Shore et al. |
| 2004/0230718 A1 | 11/2004 | Polzin et al. |
| 2004/0243769 A1 | 12/2004 | Frame et al. |
| 2004/0256638 A1 | 12/2004 | Perego et al. |
| 2004/0260957 A1 | 12/2004 | Jeddeloh et al. |
| 2005/0005184 A1 | 1/2005 | Lindt |
| 2005/0007805 A1 | 1/2005 | Ware et al. |
| 2005/0007864 A1 | 1/2005 | Chung et al. |
| 2005/0010726 A1 | 1/2005 | Rai et al. |
| 2005/0010737 A1 | 1/2005 | Ware et al. |
| 2005/0015522 A1 | 1/2005 | Elboim |
| 2005/0044313 A1 | 2/2005 | Amemiya et al. |
| 2005/0060483 A1 | 3/2005 | Azuma |
| 2005/0071554 A1 | 3/2005 | Thayer et al. |
| 2005/0071693 A1 | 3/2005 | Chun et al. |
| 2005/0086549 A1 | 4/2005 | Solomon et al. |
| 2005/0089037 A1 | 4/2005 | Kojima |
| 2005/0104653 A1 | 5/2005 | Hoshi et al. |
| 2005/0111249 A1 | 5/2005 | Yagisawa et al. |
| 2005/0140685 A1 | 6/2005 | Garg |
| 2005/0146939 A1 | 7/2005 | Conley et al. |
| 2005/0190622 A1 | 9/2005 | Choi |
| 2005/0193166 A1 | 9/2005 | Johnson et al. |
| 2005/0210216 A1 | 9/2005 | Jobs et al. |
| 2005/0223269 A1 | 10/2005 | Stolowitz |
| 2005/0240743 A1 | 10/2005 | Eng et al. |
| 2005/0246362 A1 | 11/2005 | Borland |
| 2005/0265104 A1 | 12/2005 | Remaklus et al. |
| 2005/0279837 A1 | 12/2005 | Hajji |
| 2006/0026450 A1 | 2/2006 | Bounitch |
| 2006/0053308 A1 | 3/2006 | Zimmerman |
| 2006/0064545 A1 | 3/2006 | Wintergest |
| 2006/0089107 A1 | 4/2006 | Domino |
| 2006/0161678 A1 | 7/2006 | Bopardikar |
| 2006/0161807 A1 | 7/2006 | Dawkins |
| 2006/0187715 A1 | 8/2006 | Narvaez et al. |
| 2006/0195657 A1 | 8/2006 | Tien et al. |
| 2006/0224560 A1 | 10/2006 | Makita |
| 2006/0236027 A1 | 10/2006 | Jain et al. |

(56) References Cited

U.S. PATENT DOCUMENTS

| | | |
|---|---|---|
| 2006/0253721 A1 | 11/2006 | Johnson |
| 2006/0271725 A1 | 11/2006 | Wong |
| 2006/0277310 A1 | 12/2006 | Kalos et al. |
| 2007/0002663 A1 | 1/2007 | Schaefer |
| 2007/0061513 A1 | 3/2007 | Tsumagari et al. |
| 2007/0079219 A1 | 4/2007 | Nagai et al. |
| 2007/0088754 A1 | 4/2007 | Brannon et al. |
| 2007/0088976 A1 | 4/2007 | Daikokuya et al. |
| 2007/0089045 A1 | 4/2007 | Corbett et al. |
| 2007/0101075 A1 | 5/2007 | Jeddeloh |
| 2007/0113029 A1 | 5/2007 | Bennett et al. |
| 2007/0124532 A1 | 5/2007 | Bennett |
| 2007/0162516 A1 | 7/2007 | Thiel et al. |
| 2007/0279993 A1 | 12/2007 | Hemink |
| 2008/0010398 A1 | 1/2008 | Jiang |
| 2008/0052446 A1 | 2/2008 | Lasser et al. |
| 2008/0059869 A1 | 3/2008 | Brewer et al. |
| 2008/0089135 A1 | 4/2008 | Ito |
| 2008/0098054 A1 | 4/2008 | Carmody et al. |
| 2008/0109616 A1 | 5/2008 | Taylor |
| 2008/0126673 A1 | 5/2008 | Kaneda |
| 2008/0155160 A1 | 6/2008 | McDaniel |
| 2008/0168304 A1 | 7/2008 | Flynn et al. |
| 2008/0175586 A1 | 7/2008 | Perkins |
| 2008/0175589 A1 | 7/2008 | Perkins |
| 2008/0183953 A1 | 7/2008 | Flynn et al. |
| 2008/0250270 A1 | 10/2008 | Bennett |
| 2008/0282025 A1 | 11/2008 | Biswas |
| 2008/0316822 A1 | 12/2008 | Ahn et al. |
| 2008/0320366 A1 | 12/2008 | Lin |
| 2009/0006886 A1 | 1/2009 | O'Connor et al. |
| 2009/0010067 A1 | 1/2009 | Lee |
| 2009/0052892 A1 | 2/2009 | Perkins et al. |
| 2009/0089045 A1 | 4/2009 | Lenat |
| 2009/0106491 A1 | 4/2009 | Piszczek et al. |
| 2009/0147573 A1 | 6/2009 | Hemink |
| 2009/0150599 A1 | 6/2009 | Bennett |
| 2009/0172258 A1 | 7/2009 | Olbrich |
| 2009/0172335 A1 | 7/2009 | Kulkarni et al. |
| 2009/0198947 A1 | 8/2009 | Khmelnitsky |
| 2009/0204872 A1 | 8/2009 | Yu et al. |
| 2009/0319750 A1 | 12/2009 | Jobs et al. |
| 2009/0324220 A1 | 12/2009 | Perkins |
| 2010/0023672 A1 | 1/2010 | Gorobets |
| 2010/0115189 A1 | 5/2010 | Lin |
| 2011/0099320 A1 | 4/2011 | Lucas |

FOREIGN PATENT DOCUMENTS

| | | |
|---|---|---|
| JP | 1997265357 A | 10/1997 |
| JP | 2004-272576 A | 9/2004 |
| WO | WO 99/30240 | 6/1999 |
| WO | WO 99/41667 | 8/1999 |
| WO | WO 02/37293 A1 | 5/2002 |
| WO | WO 2004/102403 A2 | 11/2004 |
| WO | WO 2004/109500 A2 | 12/2004 |
| WO | WO 2004/109525 A2 | 12/2004 |
| WO | WO 2004/109526 A2 | 12/2004 |
| WO | WO 2010/071655 A1 | 6/2010 |

OTHER PUBLICATIONS

Unknown author, NXP Corp "LPC122x", datasheet, in U.S. Appl. No. 12/079,364, filed Mar. 26, 2008, undated, pp. 44 of 60.

Chang, L., et al., "Real-Time Garbage Collection for Flash-Memory Storage Systems of Real-Time embedded Systems", ACM Transactions on Embedded Computing Systems, vol. V, No. N., Jun. 2004, pp. 1-26.

Chen, P.M. et al., "Maximizing Performance in a Striped Disk Array", Computer Science Division, University of California, published prior to Jan. 1, 1990 (10 pgs).

Choudhuri, S. et al., "Real-Time Access Guarantees for NAND Flash Using Partial Block Cleaning", SEUS 2008, LNCS 5287, IFIP International Federation for Information Processing, 2008, pp. 138-149.

Choudhuri, S. et al., "Deterministic Service Guarantees for NAND Flash using Partial Block Cleaning", CODES+ISSS108, Oct. 19-24, 2008, Atlanta, Georgia, USA. Copyright 2008 ACM 978-1-60558-470-6/08/10, pp. 19-24.

"A High-Speed Channel Controller for the Chaos Router", by Robert Will: Dec. 8, 1992 pp. 1-21.

AbouGhazeleh, N., et al., "Energy Conservation in Memory Hierarchies Using Power-Aware Cashed-DRAM", Department of Computer Science, University of Pittsburgh, Technical Report: TR-05-123, pp. 1-23.

Fan, X., et al., "Modeling of DRAM Power Control Policies Using Deterministic and Stochastic Petri Nets", Department of Computer Science, Duke University, Surham, NC 27708, USA, (11 pgs).

Park, J., et al., "Coarse-Grained DRAM Power Management", Department of Computer Science, Department of Electrical Engineering and Computer Engineering, State University of New Your at New Paltz, New Paltz, NY 12561, USA (7 pgs).

Rajamani, K., et al., "Evaluating Power Management Strategies for High Performance Memory (DRAM): A Case Study for Achieving Effective Analysis by Combining Simulation Platforms and Real Hardware Performance Monitoring", IBM Austin Research Lab (10 pgs).

Intel, "Intelligent RAID 6 Theory Overview and Implementation", Intel Corporation, 2005 (5pgs). www.intel.com'design/storage/intelligent raid.htm.

NXP Corp "LPC122x", data sheet, in U.S. Appl. No. 12/079,364, undated, pp. 44 of 60.

Unknown author, "Spike Free Low Latency", obtained from Internet, www.vmen.com, © 2011, Violin Memory, Inc., (8 pgs).

Patterson, DA, et al., "A Case for Redundant Arrays of Inexpensive Disks (RAID)", Reprint from Proceedings of the ACM SIGMOD International Conference on Management of Data, pp. 109-116, Jun. 1998, pp. 3-14.

Micron, "Calculating Memory System Power for DDR", © 2001 Micron Technology, Inc., pp. 1-26.

Micron, "Mobile SDRAM Power-Saving Features", © 2002 Micron Technology, Inc., pp. 1-3.

Micron, "DDR2 CKE Power-Down Requirement", © 2003 Micron Technology, Inc., pp. 1-3.

Micron, "DDRW (Point-to-Point) Features and Functionality", © 2003 Micron Technology, Inc., pp. 1-14.

Micron, "Designing for High-Density DDR2 Memory", ©2005 Micron Technology, Inc., pp. 1-9.

Micron, "Mobile DRAM Power-Saving Features and Power Calculations", © 2005 Micron Technology, Inc., pp. 1-9.

"Mainstream Computer Components", Lec #10 Spring 2006, May 8, 2006, pp. 1-31.

Bhalodia, V., "SCALE DRAM Subsystem Power Analysis", Massachusetts Institute of Technology, Sep. 2005, pp. 1-51.

"Cycletrees: Flexible Interconnection Graphs for Parallel Computing", Margus Veanes & Jonas Barklund, 36 p., UPMAIL Technical Report No. 97, Uppsala, Sweden, Feb. 21, 1995.

"X-Tree: A Tree Structured Multi-Proce3ssor Computer Architecture", Alvin M. Despain and David A. Patterson; University of California/Computer Science Division, Berkeley, CA, p. 144-151.

"Communication in X-Tree, a Modular Multiprocessor System", by C.H. Sequin, A.M. Despain, D.A. Patterson; University of California, Computer Science Division, Electrical Engineering & Computer Sciences; Berkeley, CA, p. 194-203; 1978.

"A Graph for Interconnecting Processors in Parallel Computing", by Hong Xie; Murdock University, Murdoch, W.A., 6150 Australia; Proc. ICCI'94, p. 885-901; 1994 Int. Conf. on Computing and Information.

"A High-Speed Channel Controller for the Chaos Router", by Robert Wille; p. 1-21; Dec. 8, 1992.

"The Alewife CMMU: Addressing the Multiprocessor Communications Gap", by J. Kubiatowicz, D. Chaiken, A. Agarwal; Massachusetts Institute of Technology, Laboratory for Computer Science, Cambridge, MA; p. 1-3.

(56) References Cited

OTHER PUBLICATIONS

"Performance Evaluation of Switch-Based Wormhole Networks", by Lionel M. Ni, Yadong Gui, Sherry Moore; 1045-9219/97-1997 IEEE; p. 462-474.
Hans-Peter Messer: "PC-Hardwarebuch", 1995, Addison-Wesley, Bonn XP002412835 p. 31-36 and 580-583.
International Search Report from PCT application No. PCT/US2006/014527 dated Apr. 10, 2007 (7 pgs).
Written Opinion of the International Searching Authority from the International Search Report from PCT application No. PCT/US2006/014527 dated Apr. 10, 2007 (9 pgs).
International Search Report for International Application No. PCT/US2007022316, dated Mar. 28, 2008 (3 pgs).
Notification of the First Office Action dated Dec. 26, 2008 from the Patent Office of People's Republic of China for Chinese Patent Application No. 2006800130653 (7 pgs).
Written Opinion of the International Searching Authority from the International Search Report from PCT application No. PCT/US2008/074628 dated Mar. 24, 2009 (5 pgs).
International Search Report for International Application No. PCT/US2008/074628, dated Mar. 24, 2009 (3 pgs).
Written Opinion of the International Searching Authority from the International Search Report from PCT application No. PCT/US2008/078752 dated Mar. 31, 2009 (5 pgs).
International Search Report for International Application No. PCT/US2008/078752, dated Mar. 31, 2009 (3 pgs).
Written Opinion of the International Searching Authority from the International Search Report from PCT application No. PCT/US2008/083969 dated Apr. 30, 2009 (5 pgs).
International Search Report for International Application No. PCT/US2008/083969, dated Apr. 30, 2009, (3 pgs).
European Patent Office Communication from EPO application No. 06/750 534.7-2212 dated Jun. 5, 2009 (6 pgs).
Nov. 13, 2009 Response to European Patent Office Communication from EPO application No. 06 750 534.7-2212 dated Jun. 5, 2009 (14 pgs).
Jul. 21, 2009 Non-Final Office Action, U.S. Appl. No. 11/405,083.
Response to Jul. 21, 2009 Non-Final Office Action, U.S. Appl. No. 11/405,083, filed Oct. 7, 2009.
Jan. 21, 2009 Non-Final Office Action, U.S. Appl. No. 11/405,083.
European Search Report from EPO application No. 08836238.9 2212/2201463 dated Sep. 14, 2010 (7 pgs).
May 19, 2010 Non-Final Office Action, U.S. Appl. No. 11/975,269, (19 pgs).
Response to May 19, 2010 Non-Final Office Action, U.S. Appl. No. 11/975,269, filed in the USPTO on Nov. 9, 2010 (7 pgs).
European Patent Office Communication from EPO application No. 08836238.9-2212/2201463 dated Oct. 1, 2010 (1 pg).
European Patent Office Communication from EPO application No. 08836238.9-2212/2201463 dated Sep. 14, 2010 (7 pgs).
European Patent Office Communication from EPO application No. 07 861 460.9-2212 dated Mar. 23, 2010 (3 pgs).
May 28, 2010, Response to European Patent Office Communication from EPO application No. 07 861 460.9-2212 dated Mar. 23, 2010 (17 pgs).
European Patent Office Communication from EPO application No. 07 861 460.9-2212 dated Oct. 15, 2010 (5 pgs).
Notice of Preliminary Rejection dated Jan. 24, 2011 from the Korean Intellectual Property Office (KIPO) for Korean Patent Application No. 10-2009-7008236.
Argument and Amendment filed on Mar. 21, 2011 in the Korean Intellectual Property Office (KIPO) for Korean Patent Application No. 10-2009-7008236, (9 pgs).
Written Opinion of the International Searching Authority from International Search Report for PCT application No. PCT/US2010/052074 (8 pgs).
Response to Nov. 7, 2011, Final Office Action, U.S. Appl. No. 12/796,836, filed in the USPTO on Dec. 20, 2011 (23 pgs).
Despaux, O., "DDR SDRAM Controller Using Virtex4 FPGA Devices", 2004 Xilinx, Inc., XAPP709 (v1.0) Sep. 10, 2004, p. 1-9.
Elpida, "Low Power Function of Mobile RAMTM Deep Power Down (DPD)", Elpida Memory, Inc. 2005-2006, Date Published May 2006 (K) Japan, URL: http//www.elpida.com, p. 1-4.
Fan, X., et al., "Memory Controller Policies for DRAM Power Management", ISPLED '01, Aug. 6-7, 2001, Huntington Beach, California, USA, Copyrighe 2001 ACM 1-58113-371 May 1, 2008, (6 pgs).
Feb. 23, 2010 Non-Final Office Action, U.S. Appl. No. 11/405,083 (19 pgs).
Graefe, G. "Write-Optimized B-Trees", Proceedings of the 30$^{th}$ VLDB Conference, Toronto, Canada, 2004, pp. 672-683.
Jan. 21, 2011 Non-Final Office Action, U.S. Appl. No. 12/245,349 (20 pgs).
Jul. 21, 2010 Final Office Action, U.S. Appl. No. 11/405,083 (20 pgs).
May 19, 2010 Non-Final Office Action, U.S. Appl. No. 11/975,269.
Notice of Preliminary Rejection dated Jan. 24, 2001 from the Korean Intellectual Property Office (KIPO) for Korean Patent Application No. 10-2009-7003236.
International Search Report and Written Opinion of the International Searching for International Application No. PCT/US2008/083969, Apr. 30, 2009 (8 pgs).
Response to Feb. 23, 2010 Non-Final Office Action, U.S. Appl. No. 11/405,083, filed May 12, 2010 (30 pgs).
Response to Office Action for U.S. Appl. No. 11/405,083, filed Nov. 17, 2010, (16 pgs).
Response to May 19, 2010 Non-Final Office Action, U.S. Appl. No. 11/975,269, filed Nov. 9, 2010 (7 pgs).
Samsung Electronics Flash Memory, "1G x 8 Bit 1 2G x 8 Bit 1 4G x Bit NAND Flash Memory", K9XXG08UXA, Date Unknown, (50 pgs).
Sanders, DA, et al., "Terabyte IDE RAID-5 Disk Arrays", 2003 Conference for Computing in High Energy and Nuclear Physics, LaJolla, California, Mar. 24-28, 2003, pp. 1-8.
International Search Report and Written Opinion of the International Searching Authority for International Application No. PCT/US2010/052074, dated Jun. 30, 2011 (9 pgs).
Response to Nov. 7, 2011 Final Office Action, U.S. Appl. No. 12/796,836 filed in the PTO on Dec. 20, 2011.
Extended European Search Report in Application 11168486.6-2212, dated Sep. 20, 2011 (4 pgs).
International Search Report for PCT/US2010/062061, dated Sep. 20, 2011, (9 pgs).
Jun. 22, 2011 Final Office Action, U.S. Appl. No. 11/975,269 (14 pgs).
International Search Report for International Application No. PCT/US2010/052074 (2 pgs).
Korean Intellectual Property Office (KIPO) Office action for Korean Patent Application for 10-2010-7009902, dated Aug. 3, 2011 (16 pgs. Including English translation).
Lee et al. Inter-Pin Skew Compensation Scheme for 3.2-Gb/s/pin Parallel Interface. Journal of Semiconductor Technology and Science. vol. 10. No. 1, Mar. 2010.
International Search Report and the Written Opinion of the International Searching Authority for International App. No. PCT/US2010/037987, dated Dec. 30, 2010 (9 pgs).
Response to May 3, 2011 Final Office Action from U.S. Appl. No. 12/079,964, filed May 3, 2011 dated Jun. 16, 2011 (40 pgs).
Response to Jun. 22, 2011 Final Office Action U.S. Appl. No. 11/975,269, filed Jun. 24, 2011 (7 pgs).
V Hu et al. Inter-Signal Timing Skew Compensation of Parallel Links with Voltage-Mode Incremental Signaling. IEEE, 2008.
W. Chakraborty et al. Dynamic Thermal Clock Skew Compensation Using Tunable Delay Buffers. ACM, 2006.
Notice of Preliminary Rejection for South Korean Application No. 10-2012-7000724, dated Jun. 20, 2012 (3 pgs).
Argument and Amendment in response to the Notice of Preliminary Rejection for South Korean Application No. 10-2012-7000724, dated Jul. 13, 2012 (10 pgs).
Office Action from counterpart Chinese Application No. 200880007937.4, dated Jun. 29, 2012 and Response dated Oct. 8, 2012 (30 pgs).
European Communication from European Application No. 11168499.9, dated Oct. 22, 2012 (4 pgs).

(56) References Cited

OTHER PUBLICATIONS

Extended European Search Report for European Application No. 10786789.7 dated Nov. 22, 2012 (6 pgs).
Extended European Search Report and response for European Application No. 11168486.6, dated Apr. 19, 2012 (10 pgs).
Extended European Search Report and response for European Application No. 11168489.0, dated May 1, 2012 (10 pgs).
Extended European Search Report and response for European Application No. 11168492.4, dated May 2, 2012 (13 pgs).
Extended European Search Report and response for European Application No. 11168494.0, dated Apr. 19, 2012 (21 pgs).
Extended European Search Report and response for European Application No. 111688499.9, dated Apr. 30, 2012 (11 pgs).
Extended European Search Report and response for European Application No. 11168502.0, dated May 1, 2012 (9 pgs).
Extended European Search Report for counterpart European Application No. 08829082.0, dated Mar. 22, 2012 (8 pgs).
Extended European Search Report and response for European Application No. 11168504.6, dated Apr. 19, 2012 (10 pgs).
European Patent Office Communication for European Application No. 08742320.8, dated Feb. 28, 2012 (5 pgs).
Response to Communication from the European Patent Office for European Application No. 08742320.8, Sep. 4, 2012 (14 pgs).
International Preliminary Report on Patentability for International Application No. PCT/US2010/052074, dated Apr. 11, 2012 (4 pgs).
Notification of Reasons for Rejection and Response for Japanese Application No. 2008-507797, dated Apr. 5, 2012 (5 pgs).
Notification of Reasons for Rejection and Response for Japanese Application No. 2009-124465, dated Jun. 6, 2012 (13 pgs).
Notice of Preliminary Rejection for Korean Application No. 10-2007-7025635, dated Jul. 31, 2012, (5 pgs. With translation).
Communication from the European Patent Office for European Application No. 11168499.9, dated Oct. 22, 2012 (4 pgs).
Notice of Preliminary Rejection for South Korean Application No. 10-2012-7009026, dated Nov. 9, 2012 (10 pgs).
Office Action from co-pending U.S. Appl. No. 12/901,224, dated Oct. 18, 2012 (23 pgs).
Response to European Communication dated Apr. 10, 2012 for European Application No. 08829082.0, dated Oct. 5, 2012 (12 pgs).
Response to Notice of Preliminary Rejection for Korean Application No. 10-2007-7025635, dated Oct. 31, 2012 (10 pgs).
Decision of Final Rejection for Japanese Application No. 2008-507797, dated Jan. 7, 2013 (2 pgs).
Decision of Final Rejection for Japanese Application No. 2009-124465, dated Jan. 7, 2013 (2 pgs).
Argument and Amendment from South Korean Application No. 10-2013-7015135, dated Sep. 2, 2013 (25 pgs).
Notice of Preliminary Rejection for South Korean Application No. 10-2012-7000724, dated Feb. 20, 2013 (12 pgs).
Amendment from counterpart Korean Application No. 10-2012-7009026, dated Aug. 9, 2013, (14 pgs. with partial translation).
Response to Examination Report for European Applicataion No. 1168499.9 dated Apr. 24, 2013 (10 pgs).
Extended European Search Report for European Application No. 10822795.0, dated Apr. 29, 2013, (8 pgs).
English translation of Argument and Amendment from counterpart South Korean Application No. 10-2012-7009026 dated Aug. 9, 2013 (8 pgs).
Argument and Amendment from counterpart South Korean Application No. 10-2013-7005934, dated Dec. 18, 2013, (24 pgs).
Argument and Amendment from South Korean Application No. 10-2013-7023247, dated Jan. 10, 2014 (16 pgs).
Intel®, "Understanding the Flash Translation Layer (FTL) Specification", Dec. 1998, Order No. 297816-002, Copyright© Intel Corporation 1997, 1998, pp. 1-20.
Jeffery, C.A., "Performance Analysis of Dynamic Sparing and Error Correction Techniques for Fault Tolerance in Nanoscale Memory Structures", Thesis Presentation to the University of Florida, 2004, (104 pgs).
Juonolainen, M.K., "Cand Scient Thesis", University of Oslo, 1.2. 1999, (129 pgs).
Norvag, K., et al., "Log-Only Temporal Object Storage", Copyright 1997 IEEE, published in the Proceedings of DEXA'97, Sep. 1-2, 1997, Toulouse, France (6 pgs).
Shirriff, K.W., "Sawmill: A Logging File System for a High-Performance RAID Disk Array", Dissertation Presentation, University of California, 1995, pp. 164.
Violin Memory, Inc., "Spike Free Low Latency", obtained from Internet address: www.vmem.com, © 2011 Violin Memory, Inc., (8 pgs).
Notice of Preliminary Rejection issued in related Korean Patent Application No. 10-2010-7004676 dated Oct. 13, 2014 (10 pgs).
Argument and Amendment from related Korean Application No. 10-2014-7034695 Receipt date Jul. 3, 2015.
Office Action for related U.S. Appl. No. 14/642,910 dated Apr. 28, 2015.
Response to Office Action for related U.S. Appl. No. 14/642,910, filed May 10, 2015.

FIG. 7

| T (Tn) | A | B | C | D | p |
|---|---|---|---|---|---|
| 1 | R | R | R | R | W |
| 2 | W | R | R | R | R |
| 3 | R | W | R | R | R |
| 4 | R | R | W | R | R |
| 5 | R | R | R | W | |
| 6 | R | R | R | R | W |

US 10,176,861 B2

RAIDED MEMORY SYSTEM MANAGEMENT

TECHNICAL FIELD

This application relates to a memory system, a module of a memory system, and a method for managing the memory system.

BACKGROUND

A typical computer system includes a central processing unit, input/output devices, and memory. The central processing unit (CPU) may include logical and arithmetic processing circuits, and may also include a high speed memory for instructions and data being immediately used by the CPU. Additional memory is used to store additional instructions and data used by the computer system, and the memory may be of a volatile or non-volatile form, and be of various types, depending on cost, access speed, storage capacity, access time and throughput considerations. Overall, the amount of memory in a computer system often substantially exceeds the quantity of instructions or data that are accessed by the CPU on a short term basis.

SUMMARY

A memory system is described, comprising a memory controller, a plurality of memory modules having a module controller, a bus interface and a memory circuit. The memory modules are in communication with the memory controller, and erase operations of the memory modules are coordinated by the memory controller.

The coordinated modules may comprise a RAID (Redundant Array of Inexpensive "Disks") group where user data and redundant data for the user data are stored in the memory modules of the RAID group.

In an aspect, only one of the memory modules of the RAID group is enabled to perform an erase operation during an interval for an N+1 RAID group, and each memory module of the RAID group is enabled to perform the erase operation prior to any one of the memory modules in the RAID group performing the erase operation again. In another aspect, a memory system is described, including memory modules having a module controller, a bus interface and a memory circuit. The memory modules are connectable to a memory controller through a root module, and erase operations of a group of the memory modules are coordinated by the memory controller.

BRIEF DESCRIPTION OF THE DRAWINGS

FIG. 7 is a timing diagram of a memory system, showing memory modules used in a RAID group, and the changing status of each memory module when the memory is operated so as to permit reading of 4 memory modules simultaneously.

DESCRIPTION

Figure 1:
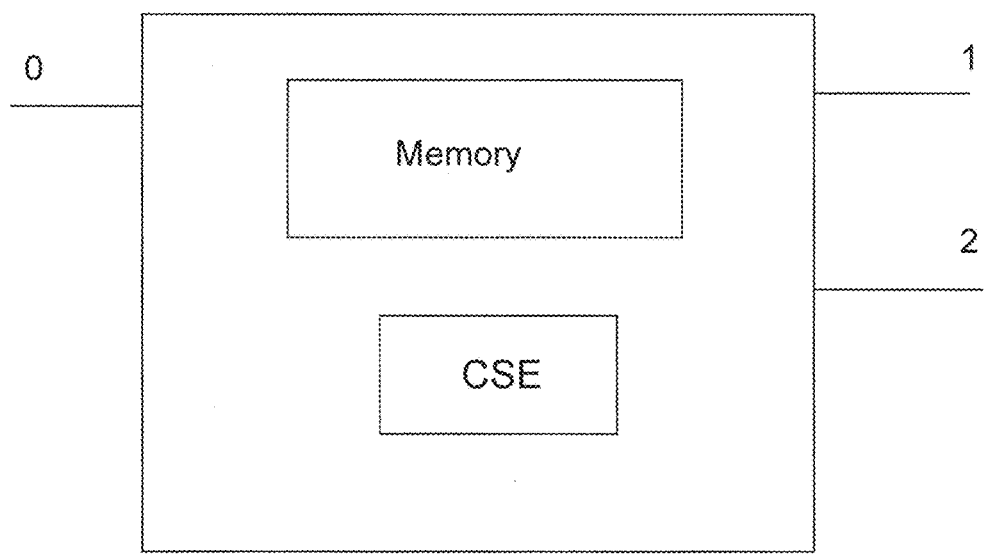
FIG. 1 is a simplified block diagram of a memory module having a configurable switching element (CSE)

Exemplary embodiments may be better understood with reference to the drawings, but these examples are not intended to be of a limiting nature. Like numbered elements in the same or different drawings perform equivalent functions. Elements may be either numbered or designated by acronyms, or both, and the choice between the representation is made merely for clarity, so that an element designated by a numeral, and the same element designated by an acronym or alphanumeric indicator should not be distinguished on that basis.

When describing a particular example, the example may include a particular feature, structure, or characteristic, but every example may not necessarily include the particular feature, structure or characteristic. This should not be taken as a suggestion or implication that the features, structure or characteristics of two or more examples should not or could not be combined, except when such a combination is explicitly excluded. When a particular feature, structure, or characteristic is described in connection with an example, a person skilled in the art may give effect to such feature, structure or characteristic in connection with other examples, whether or not explicitly described.

Where specific hardware architectures or operating system characteristics are described herein, they should be understood to be examples only, so as to facilitate the description of the subject matter of the application, and not as a limitation on the scope of the application. Memory systems are undergoing continued development, and the specific characteristics of a memory module, such as bus connection, operation speed, capacity, power consumption, electronic technology, and the like, are merely for convenience in description.

Among the types of memory which may be used in a computer system, some of the memory may be described as main memory, and may be of a volatile or non-volatile type. Such memory may often be thought of as random access memory, where any memory location may be read independently of any other memory location, and the memory may indeed be organized so as to permit such access. However, many computer operating systems access main memory in blocks of data, known as cache lines, which are transferred to a higher-speed-access cache memory associated with the central processing unit (CPU). A typical cache line may be 128 bytes, however, the size of the cache line may be greater or smaller than this value. Some memory types can be read from, or written to, individual memory addresses in a random manner. Other memory types may be accessed in a block manner.

Where memory such as flash memory is used, the memory product may have a limitation that the minimum size of a block of data that can be read is, for example, a page of 512 bytes, or some other size, which may be larger or smaller. Not all of the data that is read from the memory may be transmitted to the cache or destination.

Data being stored in a memory may be of sufficient importance that a loss of data due to a memory failure, power failure, or a transient event needs to be avoided. Apart from providing error correcting codes (ECC) associated with the data storage and transmission, the data may be stored in a redundant format, or otherwise backed up. When the redundant data is stored in the same portion of the memory system, such as main memory, a technique called RAID (originally redundant array of inexpensive disks), where the data is partitioned amongst a plurality of memory modules in a manner whereby a data word may be reconstructed from the remaining data in case of a transient or permanent failure of an element of the memory system.

Data may be further backed up or stored on rotating magnetic media (disk drives), magnetic tapes, and other media. These media typically have longer access times and lesser throughput than the memory types used as main memory. Additional memory, similar to main memory may be used, having access times closer to that typical of main memory than the backup media, and such memory modules may be called "memory appliances." Herein, the general term memory or memory system will be used for convenience. However, the examples herein would be understood by persons of skill in the art to be applicable to main memory, memory modules, memory appliances, or to any memory array, or the like.

A memory system may include a plurality of memory modules connected through a bus system to a CPU. Intermediate between the CPU and the memory system may be a memory controller, bridge, or the like, which may be considered to be either part of the CPU, the memory system, or a separate function. A memory bus may generally be described as an electrical interconnection between the CPU, or a memory controller MC, or the like, and a memory system comprised of memory modules MM. A description of a bus system may be found, for example in U.S. patent application Ser. No. 11/405,083. However, many other bus systems are known and may be used with the apparatus and method described herein.

In an example, the memory system may be considered to have one or more "root" modules, where a root module is the memory module proximate to the memory controller. As there may be more than one computer or memory controller, a memory system may have more than one root module. For simplicity of explanation, the description herein uses a single root module as an example.

A bus may carry for example, commands (such as READ, WRITE) from the MC to a MM, data read from the MM to the MC, and data written to the MM from the MC. Other commands, responses and status information are often carried over the bus. In some situations some of the information is carried over other transport mechanisms, which may be another bus, or a point-to-point connection; this may be called "out of band" signaling. It may also possible for data to be transferred between memory modules MM without passing through the MC.

The speed with which data can be transferred between the memory modules of a memory system and the CPU, through a single root and MC, may be termed the bus capacity. The bus capacity may be expressed in GB/s (gigabytes/second). Measurement of the bus capacity is often done by computer programs known as benchmark programs, so as to take into account any inefficiencies (so-called "overhead") in the operation. Different benchmark programs, having different objectives may yield differing results. Herein, the raw bus capacity is used for convenience of description, and a person of skill in the art will understand how to adapt this description to a particular memory system or optimization. The raw bus capacity may be estimated as the width of the data bus portion of the data bus in bits, multiplied by the clock rate. As an example, a 16 bit wide bus with a bit rate of 1 Gb/s would be said to have a raw bus capacity of $((16/8) \times 1 \times 10^9)$ =2 GB/s. Providing that the memory modules can read out data at at least this composite rate, the raw bus capacity at the root may be fully used in transferring data from the memory system to the CPU.

A memory module in a memory system may include a bus interface and individual memory circuits. Various bus systems and memory circuits are known, or are being developed. While a detailed example is provided below, the form of bus interface or the specific type or architecture of the memory components on the memory module shoud not be considered as a limitation.

In an example, the memory module MM may be as shown in FIG. 1. The memory module may include memory circuits M and a bus interface, which may be, for example, the CSE (configurable switching element) of U.S. application Ser. No. 11/405,083. This bus interface may include the electrical and protocol interface to the bus, as well as a controller and local memory. Groups of lines of a bus may be organized as a port. The memory module may have a single input port, and a single output port, in the upstream and the downstream directions, as may be typical for memory modules that are intended for a linear bus architecture, or may have an upstream port (port 1), and two or more downstream ports (ports 2 and 3), for use in a branching or tree-type memory system. In an aspect, a port may have bi-directional properties so as to be capable of moving data towards and away from the root module.

Each memory module may have a plurality of memory circuits, and the memory circuits may have differing internal organizations, electrical technologies, and grouping organizations depending on the specific technology used or, for example, changing industry standards and protocols. A memory circuit may be organized at a high level so as to be capable of reading or writing data (which may include executable code instructions) in a form usable by the computer system. Often the data size is a byte, which is 8 binary bits. As such, the capacity of a memory circuit, which may be one or more integrated circuit or similar devices, may be described in bytes: for example 1 GB (gigabyte)=$10^9$ bytes. (Without loss of generality, a distinction is not intended where a decimal approximation to an actual binary quantity is meant; for example 1 KB=1024 bytes.)

A memory circuit may be said to have a memory bandwidth. Again, there are various standards by which the bandwidth is measured, and for simplicity a raw bandwidth is used in this description. The raw bandwidth may be the width of the output data bus time the memory output clock speed. A contemporary memory circuit, such as a personal computer (PC) DIMM with a 64 bit bus interface (comprised, for example, of 8 8-bit wide DDR400 memory modules), may have a maximum raw memory bandwidth of about 3200 MB/s.

Figure 2:
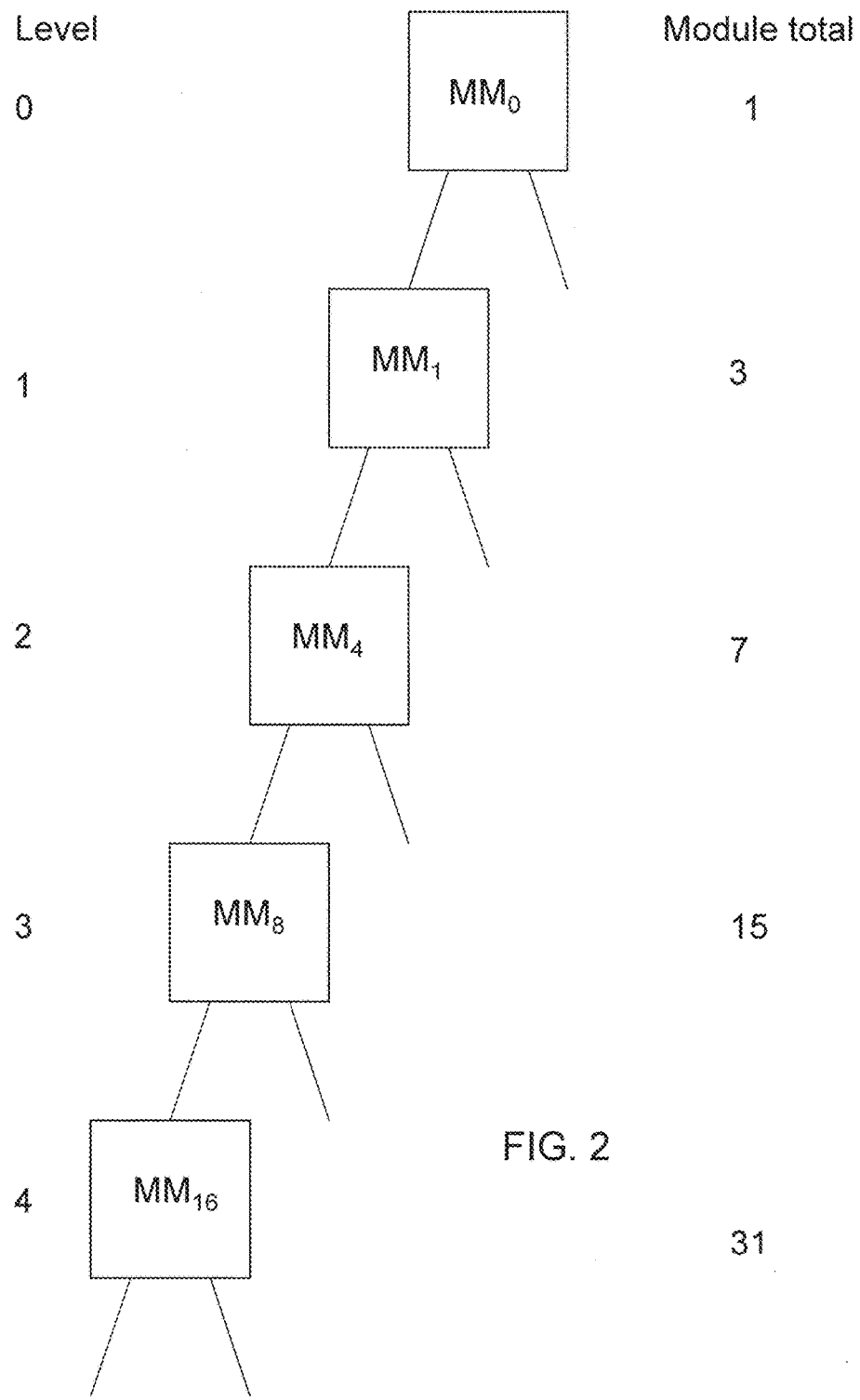
FIG. 2 is a portion of a memory system having a branching tree architecture.

FIG. 2 shows the use of a plurality of memory modules in a binary tree of order n, where only one of the branches of the tree is shown. The size of such a tree, when fully populated with memory modules is ($2^n-1$). In a situation where each of the memory modules MM (0, 1, 4, 8, 16) in a branch is transmitting data to the memory controller MC, and passing through MK, the total raw memory bandwidth supplying the data to the MC is 5×3200 MB/s, where each of the memory modules is considered to have one memory circuit with a bandwidth of 3200 MB/s. In this example, the capacity of any data bus linking electrically adjacent memory modules is considered to be the same and may be, for example, 16 GB/s. As such, when the data being read from each of the memory modules is merged at the MK upstream port interfacing with the MC, the data bandwidth of the data being read from each of the memory modules is cumulative, and the cumulative data rate is 16 GB/s. That is, the memory bandwidth may fully occupy the bus bandwidth, in this example.

Further, each of the memory modules may have a plurality of memory circuits, and the actual data bandwidth of the memory circuits on an individual memory module MM may therefore exceed the memory bandwidth of an individual memory circuit.

In the example of FIG. 2, where only one of the branches of the binary tree is shown, having 5 memory modules, there are another 26 memory modules that may have the capability of providing data to the memory controller MC. However, in this example, the bus interface to the memory controller, with a bus capacity, cannot pass additional data from other modules, as the bus capacity at the has been reached.

In an aspect, data may be transferred between other memory modules in the memory system even if the bus capacity of the bus link between $MM_0$ and the MC has been reached, providing that the transfer of data is performed over other links, such as between $MM_4$ and $MM_9$ which may not presently be fully utilized. Such transfers may be useful in memory maintenance, such as relating to reconstruction of RAID groups, or in transferring data from a slower memory module to a faster memory module, as where both DRAM and flash, for example, are used in a memory system.

Where a memory module is not being used for the purposes of passing data from one module to another or to the root, or is not being accessed, for example, for the purposes of reading or writing data to a memory circuit on the memory module, some of the circuitry of the memory module may be placed in a low-power state, so as to reduce power consumption and heat generation. Such a state may be termed a memory module idle state (MMI). The MMI state may include interrupting the operation of various clocks, disabling some or all of the links or interfaces connecting to other memory modules, or by placing some or all of the memory circuits in a lower-power-consumption state. Thus, the MMI state may be considered to be capable of having sub-states, depending on which specific aspects of the circuitry are placed in a lower-power-consumption state. Functions that may be performed in the MMI state may include, for example maintaining clock synchronization between memory modules, determining whether the memory module is being accessed, responding to in-band or out-of-band commands, refreshing the memory and the like When a memory module is being used for the purposes of passing data from one module to another or to the root, and is not currently being accessed for the purposes of reading or writing data to one or more memory circuits on the memory module, the circuitry of a memory circuit may be placed in a low-power state, so as to reduce power consumption and heat generation. Such a state may be termed a memory circuit idle state (MI). In this state, the circuitry of the CSE, or memory interface, may be in an active (MMA) state, at least in part, receiving and transmitting data between memory modules, and performing whatever other maintenance functions are needed. However the memory circuit remains in a low-power state. The MI state is one in which the data stored in the memory is preserved so that when the memory circuit is placed in a memory circuit active (MA) state, the previously stored data may be read from the memory circuit. Alternatively, data may be written to the memory circuit. Thus, the MI state may exist when the overall memory module MM is in the MA or MMI states. Table I summarizes the some of the state conditions for this example.

TABLE 1

| State | CSE | Memory Circuit | Power consumption |
|---|---|---|---|
| Memory Module Active (MMA) and data in transit only | Active | Idle (MI) | medium |
| Memory Module Idle (MMI) | Idle | Idle (MI) | low |
| Memory Module Active (MMA) and either reading or writing data to local memory | Active | Active (MA) | high |

In this description, only one memory circuit per memory module has been considered. However, where more than one memory circuit is present on a memory module, each of the memory circuits may be active, or idle, depending on whether data is being written or read from the specific memory circuit.

Figure 3:
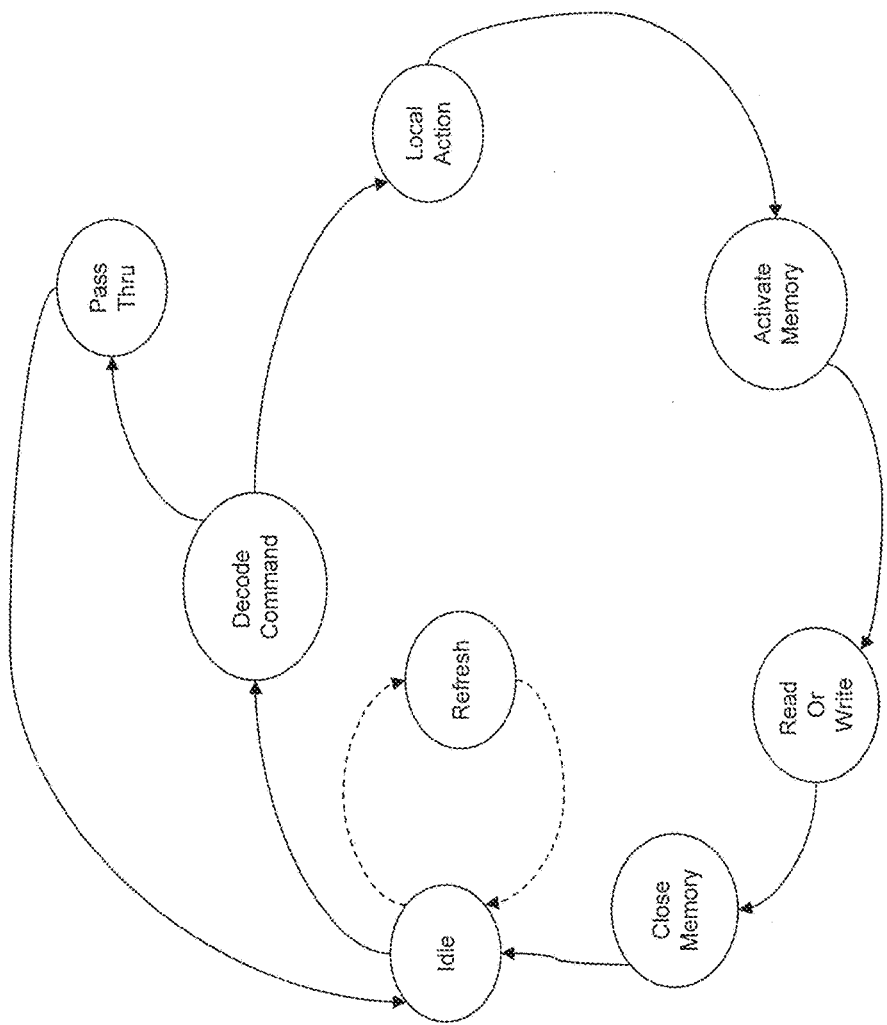
FIG. 3 is a state transition diagram for the CSE.

FIG. 3 shows a state diagram for the CSE of a MM. The diagram does not show aspects of the operation of a CSE that relate to initialization, maintenance of clock synchronization, configuration of the CSE, and the like, which are generally considered to be overhead operations, and are incidental to the functions of the memory system of reading, writing and transmitting data. Such overhead functions may be performed while the CSE is in an idle, or low power, state. The idle state may be entered when there is no data to be read, written or transmitted by or through the memory module. The idle state is a lower power state than the active states, however, such functions as clock synchronization, and the like, may be periodically performed.

The CSE is used in this example as a local controller, and may include, for example, a microprocessor or similar computing device, scratch and program memory, various clocks, including a memory refresh clock, and interfaces to the bus and to the memory. Some of the functions may be performed by discrete circuits, by more than one processor, clock, or the like, and all of the components may not be in a single electronic package.

The term "low power state" or "idle state" may refer to any one of a plurality of operating conditions where the power consumption of a circuit or portion thereof is reduced by temporarily disabling or limiting a function, slowing a clock rate, or the like, in response to a schedule, to received commands, to sensing the state of another circuit, or the like. The examples herein are not intended to limit the number or characteristics of low-power states that may be configured or used, not the combinations of low-power states that are possible.

In an aspect, the presence of a routing or command signal may be detected by a signal presence indicator or, for example, by maintaining, for example, one lane of the bus interface, or a signal presence indicator, active so that routing signals may be received, interpreted, or forwarded. Where a signal presence indicator, or the routing signal, contains information relating to a function of the local memory module, the routing or command is interpreted and an appropriate action performed. Where the routing is such that the data or command is not intended for the local module, a portion of the CSE may be activated so as to pass the command or data to an appropriate output port, and then the CSE may return to the idle state. Although not shown, other states may exist, so that, for example, the reverse bus path may be pre-activated for a response from a downstream module after a predetermined period of time.

Where the routing information or command is intended for the local module, the command may, for example, be for a read or a write operation. The memory may be in a low-power or memory-circuit-idle (MI) state, and may need to be activated in order to perform the function of the command. Typically such a function would be a read or a write operation, but other memory operations may also be performed. After performing the read or write operation, which may be for a data element of a specified size, such as a byte, sector, page, or block, the memory may be returned to a low-power state by an operation which may be termed closing the memory, after which the CSE and/or the MM may return to an idle state.

Figure 4:
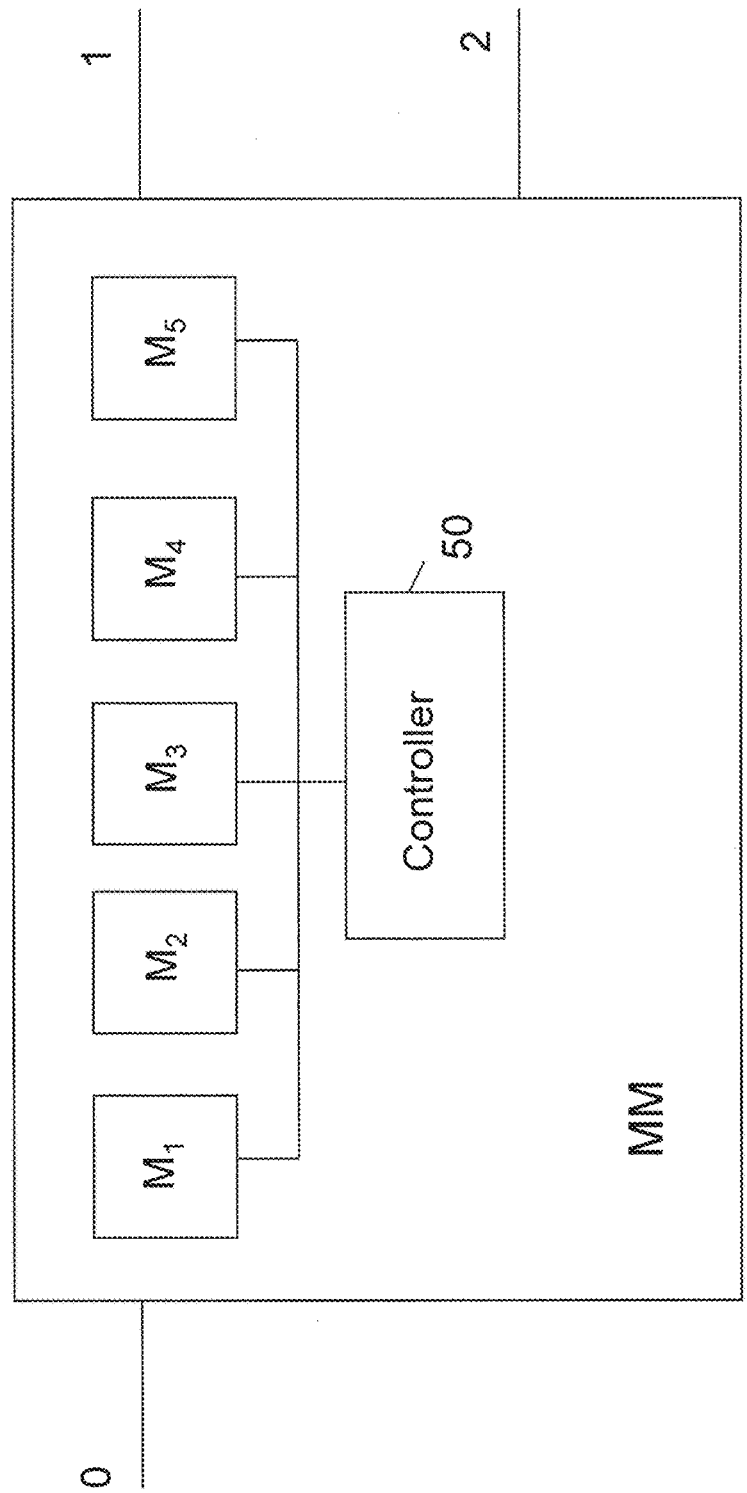
FIG. 4 is a block diagram of a memory module having a plurality of memory circuits.

FIG. 4 illustrates a memory module MM having a CSE or controller 50 and a plurality of memory circuits M. Each of the memory circuits M may have the capability of storing data in a form where a byte, word, group of words, page, or the like, may be accessed for reading or writing data on the basis of routing information or commands received by the memory module and interpreted by the CSE. For example, where data is being written or read from memory circuit $M_1$, memory circuits $M_2$-$M_5$ may remain in an idle state.

In an aspect, the memory circuit may utilize flash memory or dynamic random access memory (DRAM) as examples of non-volatile and volatile memory types. Flash memory is known to retain data stored therein even when the power supply is interrupted. However, DRAM memory circuits store the information as electrical charge in capacitive circuit, and the electrical charge slowly leaks from the capacitor due to resistive paths. Hence, in order to avoid loss of the data in memory, the power supply needs to be present, and the charge on each capacitive element needs to be renewed (refreshed) within a specific time intervals. The process may be termed "refreshing the memory". Maintaining the power supply may be performed at a module or system level by a battery, an uninterruptible power supply, or the like. However, a power supply that is dependent on the prime power, and does not have a power supply maintenance capability, such as a back-up battery or other uninterruptible power supply, may also be used. In such an instance, a power supply prime power failure may result in loss of data stored in the DRAM memory, or data held in intermediate memories, and such data may be recoverable if a back-up memory is used.

Refreshing the memory is usually performed at the memory circuit, although the process may be controlled or initiated elsewhere, for example, by the local controller such as the CSE, or by the memory controller MC.

Figure 5:
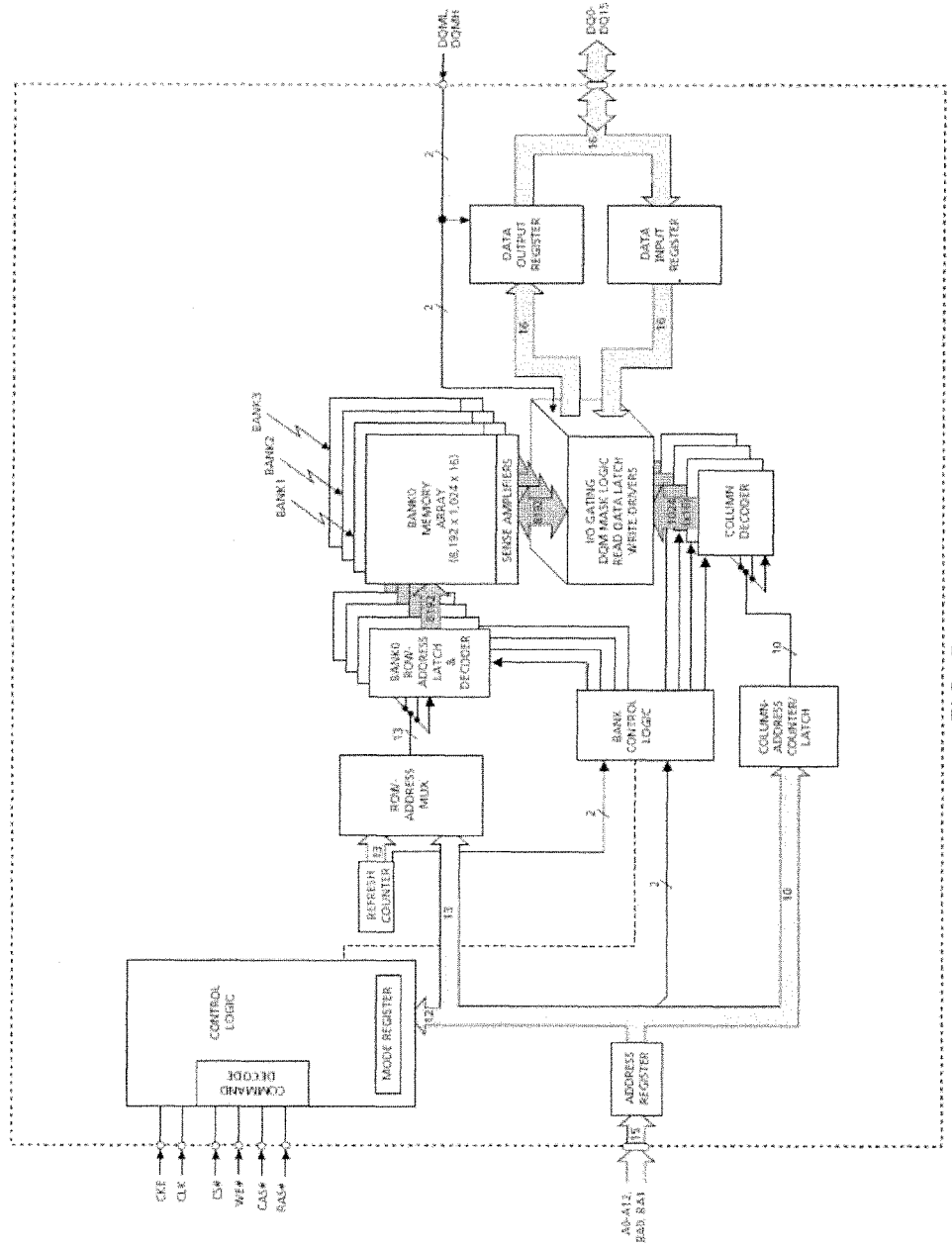
FIG. 5 is a block diagram of a commercial memory circuit.

For purposes of illustration, and not by way of limitation, a DRAM memory circuit may be one which meets the requirements of double-data-rate DRAM, as published by JEDEC, and which may be currently in use in industry standardized DIMM (dual in-line memory module) products. An example of a memory circuit which may be used in such a product is a MT48LC 128M4A2 synchronous DRAM (SDRAM) device, available from Micron Technology, Inc. (Boise, Id.). A block diagram of the memory circuit, as published by Micron, is shown in FIG. 5. Each of the memory banks in the memory circuit is organized as 8182 rows by 4096 columns by four bits. Read and write accesses to a DRAM circuit are burst oriented. That is, accesses start at a selected location and continue for a programmed number of locations in a programmed sequence. For purposes of this specification, the general operation of the DRAM circuit shown in FIG. 5 would be understood by persons of ordinary skill in the art, and only specific aspects of the operation are discussed in detail.

Operation of a DRAM is characterized by "opening" and "closing" a bank of the memory. The process is similar for both reading and writing, and for simplicity, the process will be described as reading, without intending to limit the generality of the description. Prior to executing a read command, the memory bank must be "opened." A row of the memory bank remains open for accesses to data stored in the row of the memory bank until the bank is closed, or deactivated by a PRECHARGE command. The PRECHARGE command must be issued before opening a different row in the same bank, or another bank. Depending on the design of the computer operating system, and other factors, a bank may be left in the active state after a read operation, closed after a read operation, or a combination of either operation, depending on other system parameters.

The PRECHARGE command may be used to deactivate the open row in a particular bank, or the open row in all banks. After a time interval $t_{RP}$ (typically 20 ns), the banks will be available for a subsequent row access.

In order to maintain the integrity of the data, each of the rows of a DRAM memory circuit needs be refreshed periodically, or at least once during a specified time interval in order to avoid data loss or corruption. As specified for the Micron memory circuit, and for a case temperature less than 85° C., each of the rows is refreshed at least once about every 64 ms ($t_{REF}$). Two different forms of refresh command may be used: AUTO REFRESH and SELF REFRESH. The AUTO REFRESH command is non persistent, and for a 512 MB DRAM, 8, 192 AUTO REFRESH commands, which may be issued as individual commands every 7.81 μs, will meet the specified refresh requirement and ensure that each row is refreshed. In an alternative, bursts of AUTO REFRESH commands may be issued at a minimum cycle rate interval ($t_{RF}$).

The address of the row to be refreshed may be generated internally to the memory circuit and may not need to be provided by the local controller, memory controller or other external device. On the other hand, a PRECHARGE command and an address provided externally will accomplish a similar objective, but may have greater overhead.

The SELF REFRESH command can be used to retain the data integrity in the DRAM, even if the rest of the memory system is in a lower power state. That is, when in a self-refresh mode, the DRAM retains data without an external stimulus. Once the self-refresh mode is engaged, the DRAM provides its own internal clocking so as to perform refresh cycles. However, the DRAM may need to remain in the self-refresh mode for a minimum period, which may be up to about 2 μs.

During self-refresh mode, the memory circuit cycles through the DRAM array, performing the minimum refresh activity necessary to maintain the data. To accomplish this, the memory circuit maintains an internal row/bank address counter that is not accessible to the memory controller. Upon exiting the self-refresh mode, the memory controller is not aware of which row was last refreshed in self-refresh mode, and consequently cannot continue explicit refresh operations unless it first performs a burst refresh to every row in sequence. While this situation may be accommodated in applications where the objective of the self-refresh mode is to place the memory circuit in a low-power-consumption mode for an extended period of time, such as for a portable apparatus, the need for a burst refresh every time a self-refresh mode is interrupted for a read or a write operation introduces substantial overhead.

The electrical current requirements of a memory circuit vary considerably between the various modes of operation.

For example, the average current in the SELF REFRESH or in STANDBY modes may be about 6 mA, while the operating current during a read or write operation may be about 115 mA or more. When the memory is in an active standby mode the operating current may be about 45 mA. The power consumption of a memory circuit may thus be reduced, when not reading or writing data, by operating the memory circuit either in SELF REFRESH mode, or in STANDBY or ACTIVE STANDBY mode with a wake-up to perform AUTOREFRESH. .

When describing higher power states and lower power states, the term is intended to be understood as a relative term, with respect to the particular electronic component being discussed. A lower power state of one type of component may be higher in quantitative power consumption than a high power state of another type of electronic component. Also, some low power states may have a low average power consumption, with occasional high power consumption intervals. One such example may be the state where a memory circuit has the clock disabled (CKE low) and the clock is periodically enabled (CKE high) so that an AUTORFRESH command may be executed, and the clock then disabled again.

Figure 6:
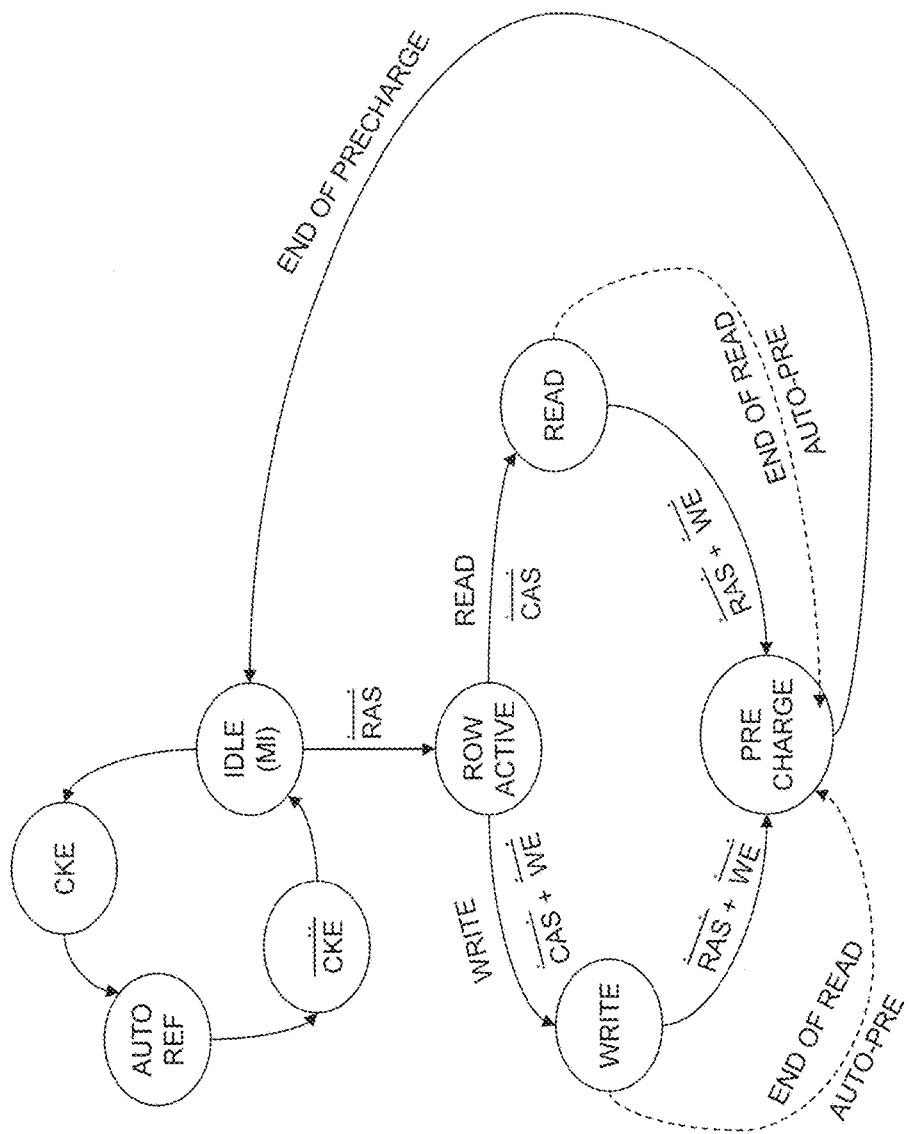
FIG. 6 is a state transition diagram for a memory circuit.

FIG. 6 shows an example of the states of a memory circuit some of which may result in a lower overall power consumption. When a read or a write operation is not in progress, the memory circuit may be in an idle state (MI). During a MI state the command line CKE may be low, which would disable internal circuitry so as to save reduce power consumption. On a periodic basis, such as approximately every 7.81 µs, the CKE may be high so as to enable the internal circuitry, and a AUTO REFRESH command issued so as to refresh a row of one or more banks of the memory circuit. The memory circuit is then returned to the MI state by returning the CKE to a low state. This sequence of operations results in the periodic refresh of each of the rows of the memory circuit within the specified time for maintaining the integrity of the stored data. Other sequences of issuing an AUTO REFRESH command may be used, including bursts of AUTO REFRESH commands, so long as the overall effect is to refresh each of the rows within the specified time period.

When the CSE on the memory module has received an instruction that a read or write operation is to be performed on a memory circuit of the memory module, the CSE issues commands so as to make an appropriate addressed row of the memory circuit active. To use the terminology of the JEDEC standard, a /RAS command is asserted. The "/" is intended to be read as an overscore, and interpreted to mean that the command is asserted by a low data state on the command line. In the active state, the selected row is available for reading or writing and the function is selected by asserting /CAS+/WE for a write operation, or /CAS for a read operation. Upon completion of the operation, or a sequence of operations on a row of the memory circuit, the row is closed by a PRECHARGE command, which returns the memory circuit to an idle state.

The PRECHARGE command may issue as a result of the CSE issuing a /RAS+/WE command or where the read or write command included an AUTO PRECHARGE command.

AUTO REFRESH commands may be issued by the CSE, based on the state of the CSE, and active connectivity between the individual memory modules MM and the memory controller MC need not be maintained in order to manage the refreshing of the memory circuits. The individual memory modules MM may manage the refreshing of the associated memory circuits M depending on the usage of the memory circuits. The usage of the memory circuits is dependent on the data required to be read or written, for example, by the CPU, or by an external device.

In an example, the memory module of FIG. 4 may have 6 groups of memory circuits each having the ability to store 1 GB of data, so that the total memory capacity of the MM is 6 GB. Each of the memory circuit groups may have a memory bandwidth of 3200 MB/s. If the bus between the memory modules has a capacity of 16 GB/s, then a single group of memory circuits does not produce a sufficient data rate to occupy the entire bus capacity. However, where 5 of the 6 memory circuit groups were being read simultaneously, then the bus capacity would be reached. In this example, only one of the memory modules of the tree of memory modules is sufficient to satisfy the bus capacity at the root. Thus, the other memory modules MM in the memory system may be in states where at least one of the CSE (which includes the bus interface) or the memory circuits M are in an idle state.

The example has been simplified by describing the memory circuits being read as being on a single memory module, however, a person of skill in the art would recognize that the memory circuits being read may be distributed so as to be located on a plurality of memory modules MM.

In another example, the data for a cache line or other data size may be stored in a RAIDed fashion; for example, in a RAID 4+1 architecture, as shown in FIG. 7. The data is distributed over 4 separate memory modules, and a parity calculation may be performed as an exclusive-OR operation over the data so as to store the parity data in a fifth module. This method of storing data permits the recovery of the data if any one of the five modules fails, or the data is lost for another reason. In such a system, each read request for a cache line would result in activating five memory modules, rather than the one module in the previous examples. However, except for the increase in the amount of data resulting from the storage of the parity information, the overall data rate is unchanged, and therefore the individual memory circuits may be active for a shorter period of time.

This discussion does not take into account changes in the overhead associated with an increased number of commands, error checking and the like, but suggests that the performance and power consumption of a RAIDed system should be similar to that previously described. The actual performance obtained would depend on the loading models, block sizes accessed, and the like.

In an aspect, a memory module MM of a memory system may schedule and perform refresh operations on the memory circuits M independently of the memory controller MC. The local controller, such as the CSE may initiate or control the refresh operations for memory circuits associated therewith based on, for example, the lack of pending or forecast read or write operations. The refresh operations may be performed in a periodic sequence, or as a burst mode where a plurality of memory refresh operations are performed in rapid sequence. Such a burst sequence may be used to minimize the interaction between the refresh operations and the read or write requests. As such, each of the memory modules may schedule the refresh operations for the memory circuits associated with the module without synchronization with the memory controller.

As shown in FIG. 7, in an aspect such as where the memory is operated as a RAIDed memory, a memory module may be associated with a position in a RAID group where the operation of the individual memory modules MM or memory circuits M is synchronized such that, for example, in a 4+1 RAID configuration such as described in U.S. Pat. No. 12/079,364, four of the five memory modules may be immediately accessed for a read operation. In such a configuration, a group of memory modules may be synchronized by a memory controller MC so that only one of the memory modules associated with the RAID group is performing refresh operations at any time (or in the case of flash memory, erase or programming operations). Such refresh operations may be performed in a bust mode, rather than at a uniform periodic interval over the refresh interval ($t_{REF}$). The memory module performing the refresh operations may not return data in response to a read request if the refresh operations are in progress at the time of the request. However, by using the data recovery properties of RAID configuration, the requested data may be available without an increase in latency. As described in U.S. application Ser. No. 12/079,364 where a 4+1 RAID configuration is employed, 4 of the 5 memory modules MM would be available for any read operation. Should the fifth memory module that is not available have information designated as data rather than parity information, the parity information, which would be available from one of the 4 modules being read maybe used to reconstruct the data using an XOR computation. When the memory modules have DRAM memory circuits as the memory circuits, the interval during which the refresh operations are performed may be shorter than $t_{REF}$.

The refresh operations of a group of the memory modules MM may be scheduled by the memory controller MC so as to associate the memory modules with RAID groups. Alternatively, individual memory circuits M may be associated with RAID groups and the refresh timing of each of the memory circuits in the group may be controlled so as to provide immediate access to at least the minimum number of memory circuits so as to reconstruct the RAIDed data.

In a typical DRAM circuit, the memory needs to be entirely refreshed about every 64 msec by specification, in order to avoid loss of data. This is termed the static refresh time or refresh interval, and may be performed by distributing the refresh operations so that a refresh operation is performed every 7.81 usec. However the time to perform the refresh operation is approximately 75 nsec. As such, up to about 104 refresh operations could be performed during the inter-refresh interval of 7.81 usec associated with one distributed refresh interval. Only about 80 such burst intervals may be needed during a 64 msec period.

As four of the five memory modules in a RAID group are always available for reading, the effect of refreshing the DRAM memory is not apparent with respect to any read operation. The maximum latency for a write operation may be a single distributed refresh interval for one of the modules. Alternatively, the burst refresh operation may be suspended whenever there is a pending write request. In another aspect, a plurality of smaller bust refresh operations may be scheduled so that they may be completed without significant effect on the write latency. In this manner, the effect of the refresh operations for volatile memory on the read or write latency may be minimized or avoided.

In an analogous manner, when flash memory is used, lower power states of the memory module MM may be used for housekeeping operations such as memory scavenging, testing, or the like, when read or write operations on the local memory are not being performed in response to requests by the memory controller MC.

Figure 8:
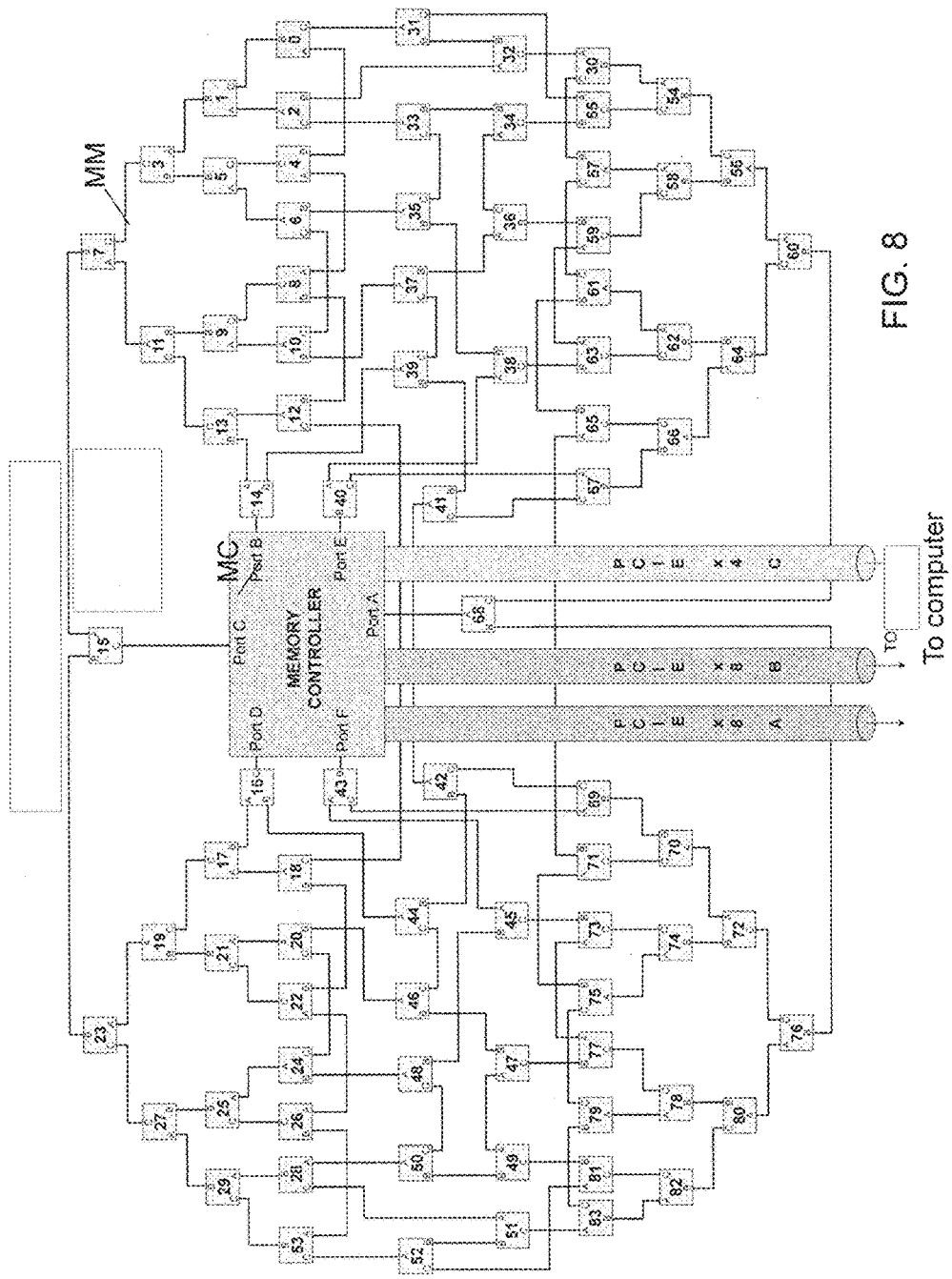
FIG. 8 is a block diagram of a plurality of memory modules of a memory system arranged in a tree structure with multiple roots.

FIG. 8 is an example of a memory system having a plurality of modules and connected in a tree-like architecture. Each of the memory modules MM is numbered, with numbers from 0 to 83, and the interconnections between memory modules MM shown as lines connecting each of three ports, which may be bidirectional ports, on each module, to other modules. The details of this arrangement may be found in U.S. application Ser. No. 11/405,083. As configured, the memory system has six root memory modules, which are those numbered 14, 15, 16, 41, 43 and 68, connecting to a memory controller having ports A-E, so as to maintain connectivity in the event of a module failure and to permit hot-swapping of failed memory modules. In an aspect, a high speed bus may be used such that a mixture of memory types may be employed in the memory modules, and the interface characteristics harmonized by a controller on the module. The controller may be a CSE.

Each of the memory modules MM 0-83 may be operated such that the refreshing of the memory on modules is performed independently of each of the other modules, and without continual transmission of commands from the memory controller. Alternatively, groups of memory modules may have refresh or erase operations, for example, synchronized or scheduled, as has been described, so as to reduce the latency for read or write operations on the memory when the memory is operated, in whole or in part, as a RAIDed storage device.

A plurality of connections, which may be a PCI Express or other interface may be provided between the memory controller MC and one or more computers. The memory controller may be a plurality of memory controllers so as to provide for redundancy in case of a hardware failure. The connectivity of the modules, memory controllers, and computer interfaces may be arranged so as to permit reconfiguration of the data paths in the event of a hardware failure, and may permit the replacement of a failed module without taking the memory system out of service.

In a memory system, such as in the example of FIG. 8, not all of the memory modules MM may be active. This may arise if the computer systems using data from the memory system do not have a high demand for the data being stored in the memory system, or, if the bandwidth of the data bus at various places in the memory system is filled by the data rate of memory modules responding to read or write commands. Where one or more of the modules is not in a state where the module is being read from or written to, the module may be in a state of lower power consumption, as described previously. In an aspect, each memory module may be considered to be in a lower power state when the associated memory circuit on the memory module is idle, or being refreshed by a AUTOREFRESH or similar function. The memory module may be in another form of lower power consumption state where the memory module interface is not engaged in processing or forwarding commands or data to other modules, either upstream or downstream from the subject memory module.

A memory module may thus be configured to be in a lower power consumption state, and transition into an appropriate higher power state for the purposes of, for example, a read or write operation on the memory of the memory module, or the pass data or commands from one memory module to another, or to the memory controller. A memory module entering the higher power state may remain in that state until completion of the commanded operation, such as reading data, and then assess the operational requirements of the memory module. Providing that no further read or write operations are pending, and that the refresh status of the memory modules is satisfactory, the memory module may enter a lower power state. During the lower power state, the refresh operations for the memory circuit may be performed as required by, as previously described, in an example, by enabling the memory clock and issuing an AUTOREFRESH command or similar function.

Thus, whether the memory module is in a high power state or a lower power state is may be data dependent result, and the status of memory modules may change dynamically. However, as the memory module may transition to a lower power state when not responding to demands for service, the overall power consumption is reduced. This is accomplished while maintaining an appropriate refresh rate so as to avoid data loss. Where a plurality of memory modules are incorporated in a memory system, the modules may be arranged so that the determination of the power status, or the timing of refresh operations are autonomous of each other.

The required refresh interval for a DRAM memory circuit specified by the manufacturer may be at a maximum operating temperature, with larger refresh intervals being possible at lower operating temperatures. An appropriate refresh rate may be determined based on the temperature of a module of a group of modules, a maximum temperature of any module of a group of modules, or the like, depending on whether the refresh rate determination is made locally to a module or based on a more global temperature measurement. Where a more global determination of temperature is made, the temperature or other parameter controlling the refresh rate may be signaled to a module.

Commands initiated by the memory controller may be used to activate memory modules, either partially or fully by sending a precursor command to the memory module so as to minimize latency in responding to the command once it is received. However, the transition to a lower power state may be accomplished independently by each memory module as the considerations involved are local to the memory module.

In an aspect, a method of operating a memory system may include providing a plurality of memory modules, the memory modules connectable to a memory controller though a data bus. Each of the memory modules may have a bus interface, a local controller and local memory. The memory may be used to store, data and instructions for access by a processor through the memory controller, or may be used locally by the memory module. Each memory module may determine the nature of the data or commands received from the memory controller, directly or indirectly, or from other memory modules. The commands may be for a read or write operation to be performed on the memory of the memory module, and the associated data, or may be data or commands for use by other memory modules, and where the present memory module is used to relay the information to another module.

Where there is no data to be written or read from the present memory module, at least some of the electronic circuits of the memory module may be placed in a lower power state. Such a state may include an "off" state or a state where the circuit is in an idle more, either in whole or in part. After performing a read or a write operation, the memory module may enter a lower power state. One such state places the memory circuit in an "idle mode". Periodically, during the idle mode, the clock circuit of the memory circuit may be enabled and a refresh command issued by the local controller. The number and timing of such commands may be controlled so as to meet a refresh timing requirement for the specific memory circuits being used. Where the commands are issued individually in a periodic manner, the clock circuit of the memory circuit may be again disabled so as to enter the idle state.

Where there is not data to be relayed, or scheduled to be relayed to another module, and there are no pending read or write operations on the present module, other aspects of the module circuits may be placed in a lower power state, which may include suspending or reducing the rate of certain clocks, disabling some or all of the bus interface or the like.

In another aspect, the erase of flash memory may be coordinated by the memory controller, such that a group of memory modules may be associated with a RAID group so that the data and parity may be stored on the modules. The controllers of the memory modules associated with a RAID group may be commanded by the memory controller to operate with respect to a common time base such that one of the memory modules is performing an erase operation, while the remaining memory modules are inhibited from performing an erase operation, so that sufficient data may be immediately read from the remaining modules so as to reconstruct the data stored in the RAID group. The erase operations of the memory modules in the RAID group are scheduled such that only one of the modules in an N+1 raid group performs an erase at any time.

Alternatively, when a first memory module in a RAID group completes performing an erase operation, status information may be sent to another module in the RAID group so that an erase operation may be initiated. This may be thought of as an erase enable token and be passed by members of the RAID group. Thus, when an erase operation on one of the memory modules of the RAID group is not needed at a current time, other memory modules may be enabled to perform erase operations.

Where the terms CPU (central processing unit), processor, controller, computer, or the like are used herein, they may generally be used interchangeably. These terms have come to mean a digital computing device capable of executing program instructions so as to configure the electrical circuits of the devices to perform functions dependent on the instructions, or data, and the size, speed, internal memory capacity (if any) are subject to a wide variety of configurations, depending on the manufacturer of the devices and the specific arrangement chosen by a designer.

Alternatively, some or all the operations might be performed by specific hardware components that contain hard-wired logic or firmware instructions for performing the operations described, or by any combination of programmed computer components and custom hardware components, which may include analog circuits.

The methods described herein may be provided, at least in part, as a computer program product that may include a machine-readable medium having stored thereon instructions which may be used to program a computer (or other electronic devices) to perform the methods. For the purposes of this specification, the terms "machine-readable medium" shall be taken to include any medium that is capable of storing or encoding a sequence of instructions or data for execution by a computing machine or special-purpose hardware and that may cause the machine or special purpose hardware to perform any one of the methodologies or functions of the present invention. The term "machine-readable medium" shall accordingly be taken include, but not be limited to, solid-state memories, optical and magnetic disks, magnetic memories, optical memories, and carrier wave signals. The description of a method as being performed by a computer should not preclude the same method being performed by a person.

For example, but not by way of limitation, a machine readable medium may include read-only memory (ROM); random access memory (RAM) of all types (e.g., S-RAM, D-RAM. P-RAM); programmable read only memory (PROM); electronically alterable read only memory (EPROM); magnetic random access memory; magnetic disk storage media; flash memory; or electrical, optical, acoustical data storage medium, or the like.

While the methods disclosed herein are described and shown with reference to particular steps performed in a particular order, it will be understood that these steps may be combined, sub-divided, or reordered to from an equivalent method without departing from the teachings of the present invention. Accordingly, unless specifically indicated herein, the order and grouping of steps is not a limitation of the present invention.

Although only a few exemplary embodiments of this invention have been described in detail above, those skilled in the art will readily appreciate that many modifications are possible in the exemplary embodiments without materially departing from the novel teachings and advantages of the invention. Accordingly, all such modifications are intended to be included within the scope of this invention.

What is claimed is:

1. A memory system, comprising:
memory modules comprising a RAID group, the memory modules having a module controller, a bus interface and a FLASH memory circuit;
wherein the memory modules are connectable to a memory controller, and erase operations of the memory modules are coordinated by the memory controller; and
wherein only one of the memory modules of the RAID group is enabled to perform an erase operation during an interval, and each memory module of the RAID group is enabled to perform the erase operation prior to any one of the memory modules in the RAID group performing the erase operation another time.

2. A memory system, comprising:
memory modules comprising a RAID group, the memory modules having a module controller, a bus interface and a FLASH memory circuit
wherein the memory modules are connectable to a memory controller, and erase operations of the memory modules are coordinated by the memory controller; and
wherein the erase operations of the memory modules in the RAID group are scheduled to enable only one of the modules in an N+1 RAID group to perform erase operations during a time interval.

3. The memory system of claim 1, wherein status information is sent to another memory module when a memory module in the RAID group completes performing erase operations, and the status information initiates or enables erase operations on the another module.

4. A method of operating a memory system comprising a plurality of memory modules, each memory module having a module controller, a bus interface and a FLASH memory circuit; the memory modules connected to a memory controller using the bus interface; the method comprising:
designating a group of memory modules of the plurality of memory modules as a RAID group; and,
coordinating erase operations of memory modules of the RAID group using the memory controller to enable only one of the modules in an N+1 RAID group to perform erase operations during a time interval.

5. The method of claim 4, further comprising:
coordinating erase operations such that each memory module of the RAID group is enabled to perform erase operations prior to any one of the memory modules in the RAID group performing erase operations another time.

6. A computer program product for operating a memory system, stored on a non-transient computer readable medium, comprising:
a plurality of memory modules, each memory module having a module controller, a bus interface and a FLASH memory circuit; the memory modules connected to a memory controller using the bus interface; to perform steps of a method comprising:
designating a group of memory modules of the plurality of memory modules as a RAID group; and,
coordinating erase operations of memory modules of the RAID group using the memory controller to enable only one of the modules in an N+1 RAID group to perform erase operations during a time interval.

7. A computer program product for operating a memory system, stored on a non-transient computer readable medium, comprising:
a plurality of memory modules, each memory module having a module controller, a bus interface and a FLASH memory circuit the memory modules connected to a memory controller using the bus interface; to perform steps of a method comprising:
designating a group of memory modules of the plurality of memory modules as a RAID group; and
coordinating erase operations such that each memory module of the RAID group is enabled to perform erase operations prior to any one of the memory modules in the RAID group performing erase operations another time.

8. A memory system, comprising:
a memory controller; and
a plurality of memory modules in communication with the memory controller, a group of the memory modules configured as a RAID (Redundant Array of Independent Disks) group;
wherein erase operations performed by the memory modules of the RAID group are synchronized or scheduled so an erase operation on one of the memory modules of the RAID group is completed prior to initiating an erase operation on another memory module of the RAID group.

9. The memory system of claim 8, wherein the modules of the RAID group are operated with respect to a common time base.

10. A method of operating a memory system, the memory system comprising a plurality of memory modules in communication with a memory controller and a plurality of memory modules are operated as a RAID group;
the method comprising: storing data to the memory modules of the RAID group, wherein the stored data includes parity data for the data; initiating erase operations on a memory module of the memory modules of the RAID group;
determining that erase operations on the memory module of the group have completed; initiating erase operations on another memory module of the RAID group when the erase operations of the memory module have completed;
receiving a request for data stored on the RAID group; and reading data stored on the RAID group.

11. The method of claim 10, wherein the step of initiating comprises enabling the memory module to perform erase operations.

12. The method of claim 11, wherein a number of memory modules of the RAID group enabled to perform erase operations is limited so that data stored on the modules of the RAID group may be read without increased latency due to erase operations being performed when read operations are performed.

13. The method of claim 10, wherein the step of reading data stored on the RAID group comprises: requesting data from the memory modules of the RAID group; using data received from the memory modules to respond to the read request; or using less than all of the data needed to respond to the read request and the parity data for the data to reconstruct the data needed to respond to the read request; and responding to the read request.

* * * * *